(12) United States Patent
Lyons et al.

(10) Patent No.: US 12,476,555 B2
(45) Date of Patent: Nov. 18, 2025

(54) DC BUSBAR SYSTEM, LAMINATED DC BUSBAR AND DC BACKPLANE WITH SUPER LOW INDUCTANCE

(71) Applicant: BAE Systems Controls Inc., Endicott, NY (US)

(72) Inventors: Arthur P. Lyons, Maine, NY (US); Stephen J. Kosteva, Endicott, NY (US); Cameron R. Vakili, Binghamton, NY (US); Stephen L Homan, Endicott, NY (US); Robert J. Vovos, Vestal, NY (US)

(73) Assignee: BAE Systems Controls Inc., Endicott, NY (US)

( * ) Notice: Subject to any disclaimer, the term of this patent is extended or adjusted under 35 U.S.C. 154(b) by 448 days.

(21) Appl. No.: 18/067,172

(22) Filed: Dec. 16, 2022

(65) Prior Publication Data

US 2024/0204681 A1    Jun. 20, 2024

(51) Int. Cl.
*H02M 7/00* (2006.01)
*H02M 1/088* (2006.01)
*H05K 7/14* (2006.01)

(52) U.S. Cl.
CPC .......... *H02M 7/003* (2013.01); *H02M 1/088* (2013.01); *H05K 7/14329* (2022.08)

(58) Field of Classification Search
CPC ........ H01L 25/072; H01L 2224/73265; H05K 1/189; H05K 7/14329; H05K 2201/10037; H05K 2201/056; H05K 1/118; H02M 7/003; H02M 7/5387; H02M 1/327; H02M 7/537; H02M 1/0054
See application file for complete search history.

(56) References Cited

U.S. PATENT DOCUMENTS

| 4,250,616 | A | | 2/1981 | Klimek et al. |
| 4,450,029 | A | * | 5/1984 | Holbert ................. H02G 5/005 29/829 |
| 7,798,833 | B2 | * | 9/2010 | Holbrook ........... H05K 7/14329 361/679.01 |
| 11,335,649 | B2 | | 5/2022 | Wang et al. |
| 2004/0069527 | A1 | | 4/2004 | Vanhoutte et al. |
| 2007/0019352 | A1 | * | 1/2007 | Anthony ................. H01G 4/35 361/118 |
| 2010/0173509 | A1 | * | 7/2010 | Holbrook ........... H05K 7/14329 439/208 |
| 2012/0217032 | A1 | | 8/2012 | Beaupre et al. |

(Continued)

OTHER PUBLICATIONS

International Search Report, PCT/US23/82461, mailed Apr. 15, 2024, 10 pages.

(Continued)

*Primary Examiner* — Adam B Dravininkas
(74) *Attorney, Agent, or Firm* — Scully Scott Murphy & Presser PC; Gary McFaline

(57) ABSTRACT

A laminated DC busbar, a DC backplane and a DC busbar system with super low inductance is provided. Semiconductor switches may be connected to respective laminated DC busbars. The DC busbar system comprises a DC backplane and at least two laminated DC busbars respectively connected to semiconductor switches. The round-trip inductance between semiconductor switches connected to two adjacent laminated DC busbars via the DC backplane is less than about 7.5 nH.

11 Claims, 21 Drawing Sheets

(56) References Cited

U.S. PATENT DOCUMENTS

| | | |
|---|---|---|
| 2016/0094153 A1 | 3/2016 | Li et al. |
| 2018/0123334 A1* | 5/2018 | She .......................... H01G 4/38 |
| 2020/0343517 A1 | 10/2020 | Fees et al. |
| 2020/0366216 A1* | 11/2020 | Usui ..................... H02M 7/487 |
| 2022/0216724 A1* | 7/2022 | Ishitobi ................. H01R 25/16 |
| 2022/0360064 A1* | 11/2022 | Babinot ................ H02G 5/005 |

OTHER PUBLICATIONS

Gui, H., "Design of Low Inductance Busbar for 500 KVA Three-Level ANPC Converter", 2019 IEEE Energy Conversion Congress and Exposition (ECCE), 2019, pp. 7130-7137.

\* cited by examiner

DC BUSBAR SYSTEM, LAMINATED DC BUSBAR AND DC BACKPLANE WITH SUPER LOW INDUCTANCE

FIELD OF THE DISCLOSURE

This disclosure relates to direct current (DC) busbars in power systems and the connection of the DC busbars to other DC busbars via a DC backplane.

BACKGROUND

Busbars provide electrical connection between different components of a power system. These busbars may conduct high voltage and high current. Certain busbars, such as a laminated DC busbar, may be connected to terminals of semiconductor switches. The same laminated DC busbars may have a plurality of capacitors mounted thereon.

A laminated DC busbar has at least one positive conducting layer and at least one negative conducting layer. The conducting layers may be respectively separated by insulation. A laminated DC busbar has an inductance L.

The semiconductor switches produce sine waves from square waves. For example, the semiconductor switches may switch between a positive DC+ voltage and a negative DC− voltage, when impressed on an inductive load, sinusoidal current flows. An inductance loop between the capacitors on the busbar and the semiconductor switches (which also has a parasitic capacitance) may cause a voltage and current overshoot particularly during switching. Depending on the rating of the semiconductor switches, this overshoot may cause damages to the semiconductor switches.

The inductance may also cause current loops in the capacitors. These current loops may also cause ringing which increases losses and generates heat.

The semiconductor switches may be wide bandgap semiconductors. Wide bandgap semiconductor switches, such as silicon carbide (SiC), have higher switching frequencies and transition rates than certain other semiconductor switches. However, a high inductance in the busbar has a greater impact as the voltage and current switching speed increases.

Busbars may be connected to other busbars such as when a power system contains multiple modules. For example, a power system may contain a plurality of inverter modules including the semiconductor switches in each and each having laminated DC busbars. When busbars are connected, the inductance loop increases based the inductance of the busbar itself and the way the busbars are connected. Additionally, busbars may be connected to other busbars via a backplane, e.g., a busbar linking multiple connected DC busbars.

Busbars may be connected to each other and to terminals of the semiconductor switches using connecting tabs. However, connecting tabs cause in increase in the total inductance of the busbar system. This increase will limit the switching speed of the semiconductor switches and even at a lower speed, still may cause overshoot and ringing.

SUMMARY

Accordingly, disclosed is a laminated direct current (DC) busbar comprising a first conductive layer, a first insulation structure, a second conductive layer, a second insulation structure and dual adhesive layer. The first insulation structure wraps the first conductive layer, and the second insulation structure wraps the second conductive layer. The dual adhesive layer binds the first insulation structure and the second insulation structure. The first conductive layer, the second conductive layer and the first insulation structure and the second insulation structure have a bending to form a first portion and a second portion separated by the bending. The first portion and the second portion are angled relative to each other. The first portion is configured to connect the laminated DC busbar to a DC backplane. The second portion is configured to connect the laminated DC busbar to terminals of an inverter. The DC backplane is also connectable to at least one other laminated DC busbar. The inverter has a plurality of pairs of switches and respective pairs of terminals. Each pair of switches has a first terminal and a second terminal. The first portion has at least three openings for connecting the laminated DC busbar to the DC backplane. For each of the at least three openings in the first portion, each of the first conductive layer, the second conductive layer and the first insulation structure and the second insulation structure has an opening at least partially aligned therewith. The size of the openings in the first insulation structure and the second insulation structure are the same size. The conductive layer which electrically connects to the DC backplane alternates based on the at least three openings. The conductive layer which electrically connects to the DC backplane through an opening in the first portion extends into the respective opening of the first portion, whereas the conductive layer that does not electrically connect to the DC backplane through the same opening in the first portion surrounds that opening.

In an aspect of the disclosure, the second portion has a plurality of first openings and a plurality of second openings adjacent to an edge of the laminated DC busbar facing the terminals of the inverter. The first openings and the second openings alternate on the first conductive layer, and the first openings and the second openings alternate on the second conductive layer. The first openings of the first conductive layer at least partially aligned with the second openings of the second conductive layer and the second openings of the first conductive layer at least partially aligned with the first openings on the second conductive layer. The first conductive layer has a plurality of first bushings. Each first bushing projects from the first conductive layer and surrounds a respective first opening of the first conductive layer. Each first bushing is configured and dimensioned to contact a respective first terminal of the inverter. The second conductive layer has a plurality of second bushings. Each second bushing projects from the second conductive layer through the first conductive layer and surrounds a respective first opening of the second conductive layer. Each second bushing is configured and dimensioned to contact a respective second terminal of the inverter. The first insulation structure and the second insulation structure have third openings at least partially aligned with the first openings and the second openings.

In an aspect of the disclosure, the first bushings and the second bushings have different heights.

In an aspect of the disclosure, the second portion has a plurality of first capacitor openings and second capacitor openings. The second capacitor opening comprises at least one lead slit and a plurality of thermal slits. The first capacitor openings and the second capacitor openings alternate on both the first conductive layer and the second conductive layer, such that a first capacitor opening of the first conductive layer aligns with the second capacitor opening of the second conductive layer. Each lead slit is configured for one of the leads of capacitors to be inserted. The first insulation structure and the second insulation structure have capacitor openings at least partially aligned with the first capacitor openings and the second capacitor openings. The capacitors are connected in parallel. In an aspect of the disclosure, the laminated DC busbar has greater than a predetermined number of capacitors. For example, the predetermined number may be 24 capacitors.

In an aspect of the disclosure, each slit for a lead is at least partially surrounded by thermal slits.

In an aspect of the disclosure, the plurality of first capacitor openings has epoxy spacers, respectively configured to a provide creepage barrier.

In an aspect of the disclosure, the first portion has 8 openings for connecting the laminated DC busbar to the DC backplane.

In an aspect of the disclosure, the first conductive layer and the second conductive layer each have a thickness of about 1 mm.

In an aspect of the disclosure, the second openings in the second portion have epoxy spacers.

In an aspect of the disclosure, the openings in a conductive layer in the first portion not making electrical contact with the DC backplane have epoxy spacers.

In an aspect of the disclosure, the first portion is orthogonal to the second portion.

In an aspect of the disclosure, a round-trip inductance between the plurality of capacitors and switches of the inverter is less than about 1.5 nH. In some aspects of the disclosure, the round-trip inductance between the plurality of capacitors and switches of the inverter is less than about 1.0 nH.

Also disclosed is a direct current (DC) backplane for a modular power control system (MPCS). The MPCS may comprise a plurality of laminated DC busbars. The DC backplane comprises two first conductive layers comprising a first-first conductive layer and a second-first conductive layer, a second conductive layer, an insulation layer between each conductive layer and two outer insulation layers. The insulation layer includes a first insulation layer sandwiched between the first-first conductive layer and the second conductive layer, and a second insulation layer is between the second-first conductive layer and the second conductive layer. The two outer insulation layers are around the first-first conductive layer and the second-first conductive layer. The DC backplane has a plurality of rows of openings extending from one outer insulation layer to the other outer insulation layer. Each row of openings is dimensioned to allow an electrical connection between a respective conductive layer of the DC backplane and a corresponding conductive layer of a laminated DC busbar of one of the modules of the MPCS. The number of openings in each row is at least three. For each opening in the DC backplane, a size of a corresponding opening in the first-first conductive layer, the second-first conductive layer and the second conductive layer changes based on which conductive layer is electrically connected to the laminated DC busbar via the respective opening. The two outer insulation layers, the first insulation layer and the second insulation layer have corresponding openings.

In an aspect of the disclosure, within each row of openings, the conductive layer which electrically connects to the laminated DC busbar alternate.

In an aspect of the disclosure, the second-first conductive layer has a plurality of bosses surrounding alternate openings in the second-first conductive layer in the same row. Each boss projects from the second-first conductive layer through a corresponding opening in the second insulation layer, the second conductive layer and the first insulation layer to make an electrical connection with the first-first conductive layer. The first conductive layer also has a plurality of bosses surrounding the same alternate openings, respectively. Each boss projects from the first-first conductive layer through a corresponding opening an outer insulation layer to make an electrical connection the first conductive layer of the laminated DC busbar.

In an aspect of the disclosure, the corresponding opening in the second conductive layer with the projecting boss passing through has an epoxy spacer.

In an aspect of the disclosure, the second conductive layer has a plurality of bosses surrounding alternate openings in the second conductive layer in the same row. Each boss projects from the second conductive layer through a corresponding opening in the first insulation layer, the first-first-conductive layer, and the outer insulation layer to make an electrical connection with the second conductive layer in the laminated DC busbar.

In an aspect of the disclosure, each corresponding opening in the first-first conductive layer with the projecting boss passing through has an epoxy spacer and the second-first conductive layer has an epoxy spacer.

In an aspect of the disclosure, each row has 8 openings for connecting to the laminated DC busbar.

In an aspect of the disclosure, the second conductive layer is twice as thick as the first-first conductive layer.

In an aspect of the disclosure, the round-trip inductance between the plurality of capacitors and DC backplane is less than about 1.5 nH. In some aspects, the round-trip inductance between the plurality of capacitors and DC backplane is less than about 1.0 nH such as 0.8 nH.

In an aspect of the disclosure, a round-trip inductance between adjacent rows of bosses in the DC backplane is less than about 1.5 nH

BRIEF DESCRIPTION OF THE DRAWINGS

FIG. 2A is a front perspective view, FIG. 2B is a back perspective view and FIG. 2C is a side view;

FIG. 10B is enlarged to highlight the region within the dotted and dashed circle in FIG. 10A;

DETAIL DESCRIPTION

Figure 1:
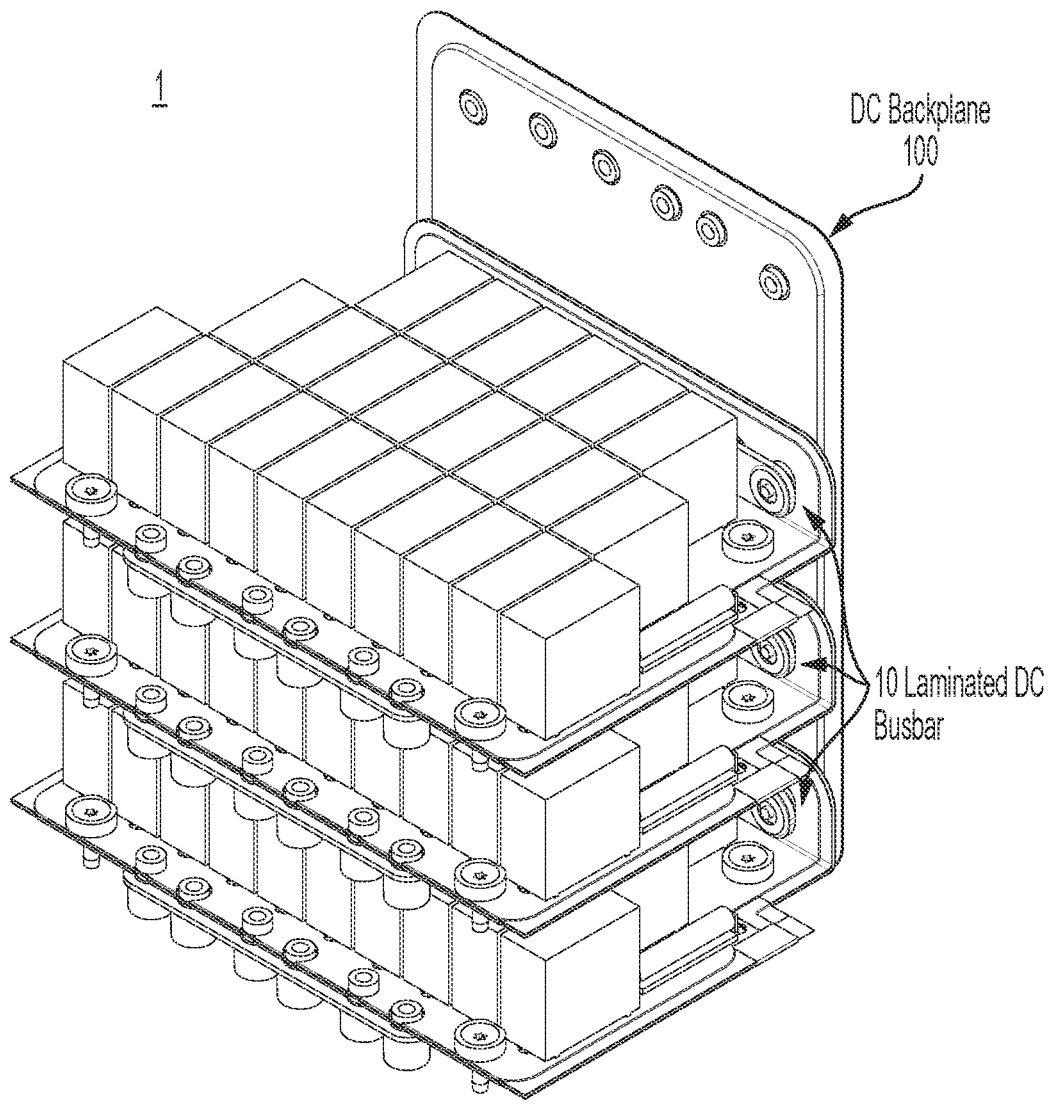
FIG. 1 illustrates an example of a DC busbar system in accordance with aspects of the disclosure, in the example three laminated DC busbars are illustrated attached to a DC backplane.

A DC busbar system 1 in accordance with aspects of the disclosure has a plurality of laminated DC busbars 10 and a DC backplane 100. The DC backplane 100 electrically connects the plurality of laminated DC busbars 10. The DC busbar system 1 may be used in a modular power control system (MPCS). A MPCS is a modular line replaceable unit (LRU) containing a plurality of inverters modules and high voltage power distribution. The MPCS is scalable and customizable to have any number of inverters modules and current interfaces. Different inverter modules may provide different phases of power. Each inverter module may have a wide bandgap switching unit 15 having 3 or more phases of switching pairs. In some aspects of the disclosure, the wide bandgap switching unit 15 provide 3 phases. However, in other aspects, the wide bandgap switching unit 15 may provide 6 phases.

The phases from the wide bandgap switching unit 15 may be connected in parallel. For example, the three phases from 3 pairs of wide bandgap semiconductor switches may be connected in parallel to provide a single phase. The current (RMS) for the single phase may be set as needed per a specific application. In some aspects of the disclosure, the single phase may be connected to an electric machine such as a traction motor. In some aspects of the current may be up to about 1125A RMS (for the single phase).

In other aspects of the disclosure, the inverter module may provide three separate phases where the current in each phase may also be set as needed per the specific application. The three-phases may be used for an electric machine such as an integrated starter generator/motor (ISGM). In some aspects of the disclosure, the current in each phase may be up to 375 A RMS.

The laminated DC busbars 10 described herein may be included in an above-described inverter module(s); and the inverter module(s) may be connected to the DC backplane 100 via the laminated DC busbars 10.

The MPCS may also include a DC interface module. The DC interface module may have a plurality of DC interfaces configured to receive DC power from an external source. The DC interface module may also include isolation monitoring and control of high voltage power distribution and low voltage power distribution in the MPCS. The DC interface module may be connected to the DC backplane via internal DC busbars.

The MPCS may also comprise a control module having hardware for controlling the inverter modules. In some aspects of the disclosure, different hardware may be used to control the three-phase inverter modules and the multiple single phase inverter modules.

The MPCS may also comprise additional DC modules such as a DC filter module which provides filtered DC interfaces. The DC interfaces in the DC filter module may comprise a fuse, contactor(s), voltage, and current sensors. In some aspects of the disclosure, the DC filter module may comprise multiple DC busbars to support high speed and low speed charging. The charging may be seeded by an external power source such as an external battery. For example, the DC filter module may comprise high speed DC busbars (high speed interface) and multiple low speed DC busbars (low speed interfaces). The specific current supported by the DC busbars in the DC filter module and respective interfaces may be based on the specific application. In some aspects of the disclosure, the high-speed interface may support a current of 600 A and the low-speed interface may support a current of 300 A.

The DC junction module may comprise a plurality of DC interfaces. The interfaces may be unfiltered. Each interface may comprise a fuse, contactor(s) and voltage and current sensors. In some aspects of the disclosure, each DC junction module may comprise 4 different interfaces. However, the number of interfaces is not limited to 4.

In some aspects of the disclosure, the DC filter module and the DC junction module may be electrically connected to the DC backplane 100 using extension busbars (both positive and negative) (not shown). When the MPCS has the DC filter module and the DC junction module, the DC interface module may be electrically connected to the DC backplane 100 via the extension busbars as well.

The MPCS may be installed in a vehicle such as a hybrid electric vehicle (HEV) or a battery electric vehicle (BEV). In some aspects of the disclosure, when used in an HEV, the DC junction module and/or the DC filter module may be omitted. The vehicle may be a personal vehicle, such as a scooter, car, motorcycle and truck or a commercial vehicle such as a truck or bus, a maritime vehicle such as a boat or submarine or a military vehicle such as a tank, self-propelled artillery, or troop transport. The vehicle may also be an airplane, helicopter, UAV, and other powered air vehicles.

The busbar system 1 in accordance with aspects of the disclosure, which include a plurality of laminated DC busbars 10 and a DC backplane 100 has a super low inductance. The super low inductance enables the busbar system 1 to be used in the MPCS. The super low inductance also allows the inverter modules to use wide bandgap semiconductor switches in the wide bandgap switching unit 15.

FIG. 1 illustrates three laminated DC busbars 10 connected to the DC backplane 100. However, the number of laminated DC busbars 10 in FIG. 1 is an example, and a different number of laminated DC busbars 10 may be connected depending on the configuration and application. For example, the system 1 may have four laminated DC busbars 10 for four inverter modules: three for three single phase inverter modules and one for a three-phase inverter module. However, since the MPCS is scalable and customizable, the MPCS may have a different number of inverter modules and thus a different number of laminated DC busbars 10.

Figure 2A:
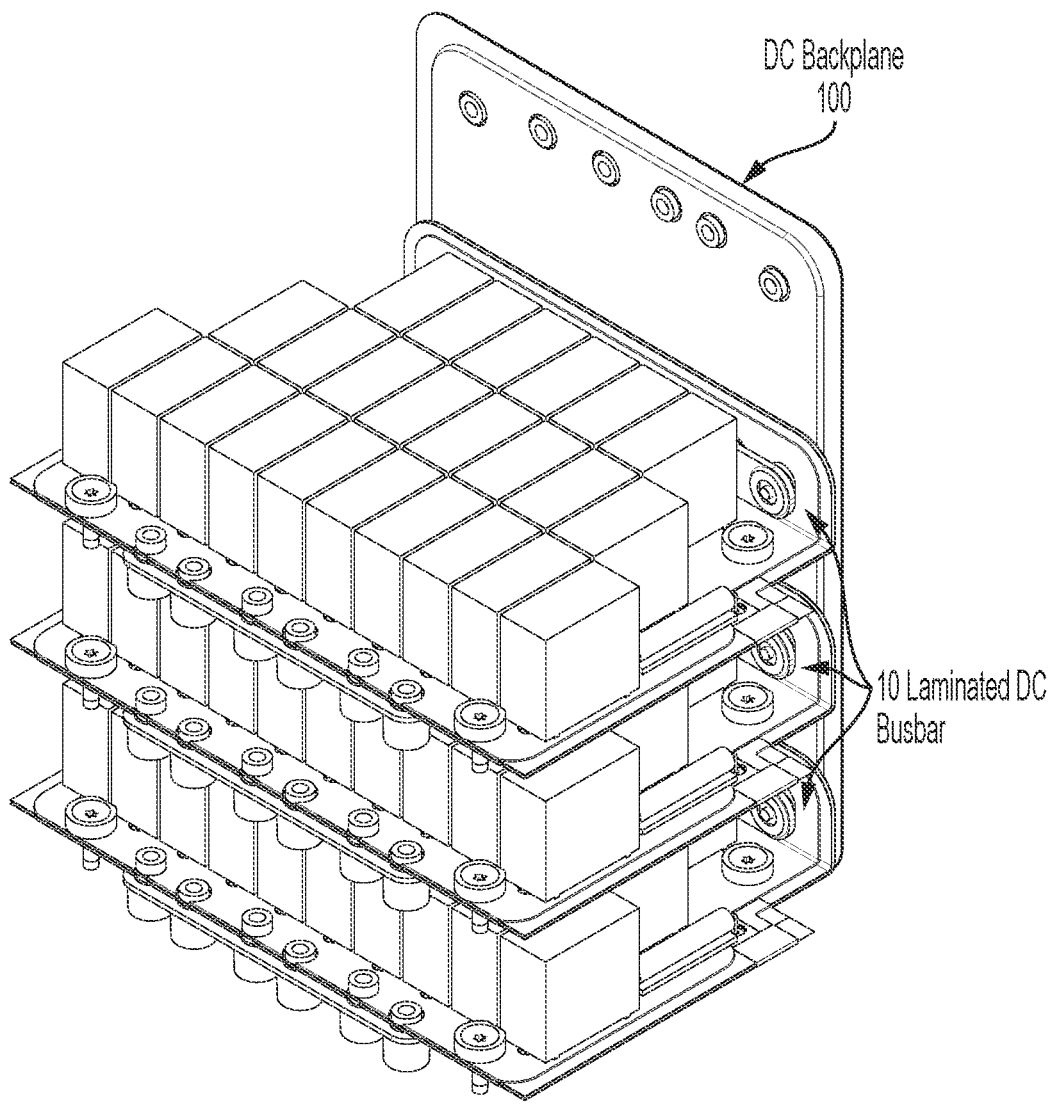
FIGS. 2A-2C illustrate views of the example DC busbar system connected to wide bandgap semiconductor switching units, respectively, where
Figure 2B:
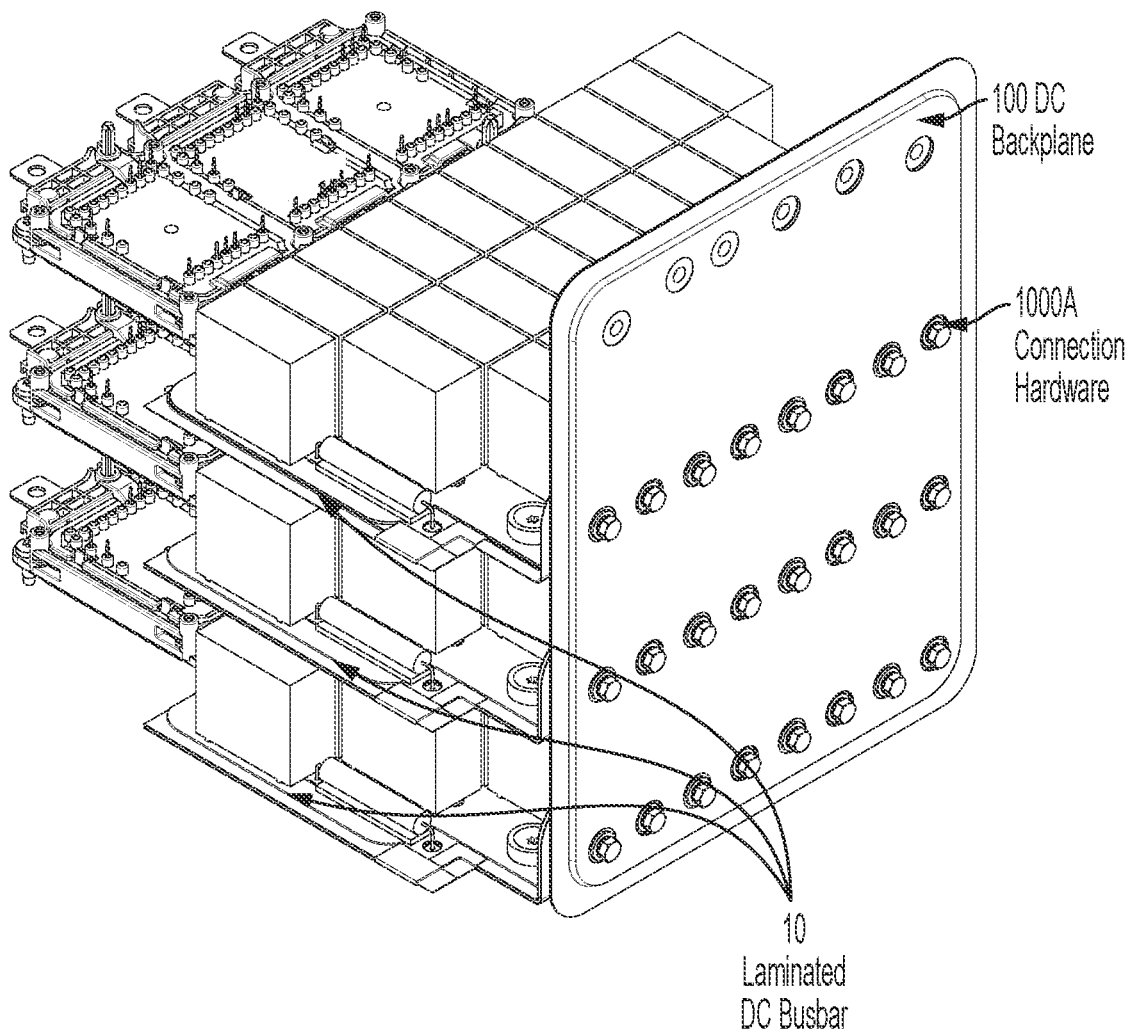
Figure 3:
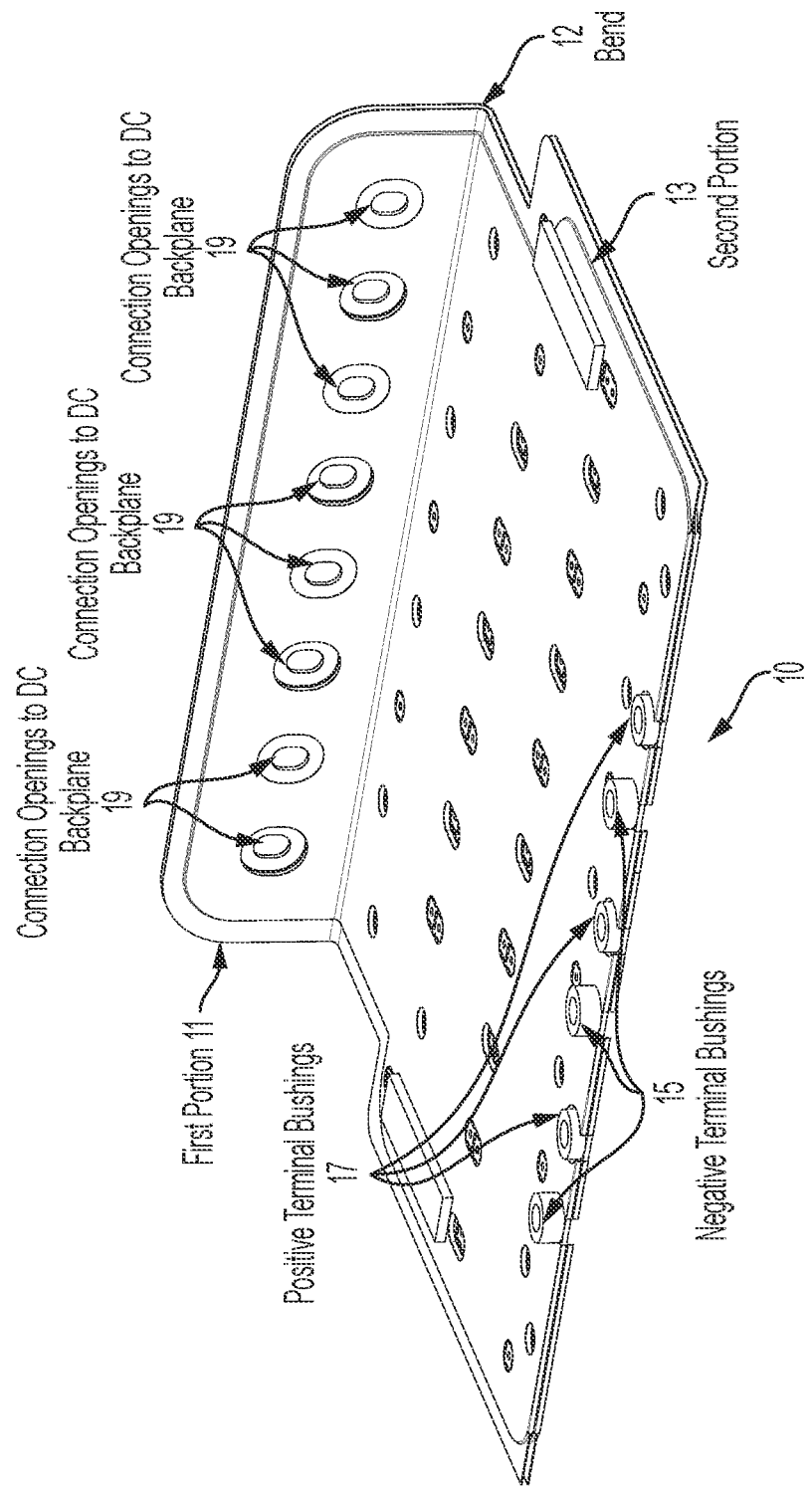
FIG. 3 illustrates an example of a laminated DC busbar in accordance with aspects of the disclosure, where the laminated DC busbar is illustrated in a perspective view.

FIG. 3 illustrates an example of a laminated DC busbar 10 in accordance with aspects of the disclosure. The laminated DC busbar 10 has a bend 12. The bend 12 divides the laminated DC busbar into a first portion 11 and a second portion 13. The first portion 11 is the part of the busbar 10 that is in contact with the DC backplane 100. The second portion 13 is the part of the busbar 10 that is in contact with the wide bandgap switching unit 15. As illustrated in FIG. 2B, the first portion 11 is substantially parallel to the DC backplane 100 when attached and is flush with the same. The second portion 13 and the first portion 11 are angled with respect to each other. In some aspects, the second portion 13 is orthogonal to the first portion 11.

The busbar system 1 is a "tabless system". Tabless as used herein means that the laminated DC busbar 10 does not have tabs projecting from the respective conductors 20, 30 to connect to the wide bandgap switching unit 15 or the DC backplane 100 because tabs increase the busbar inductance.

Figure 5:
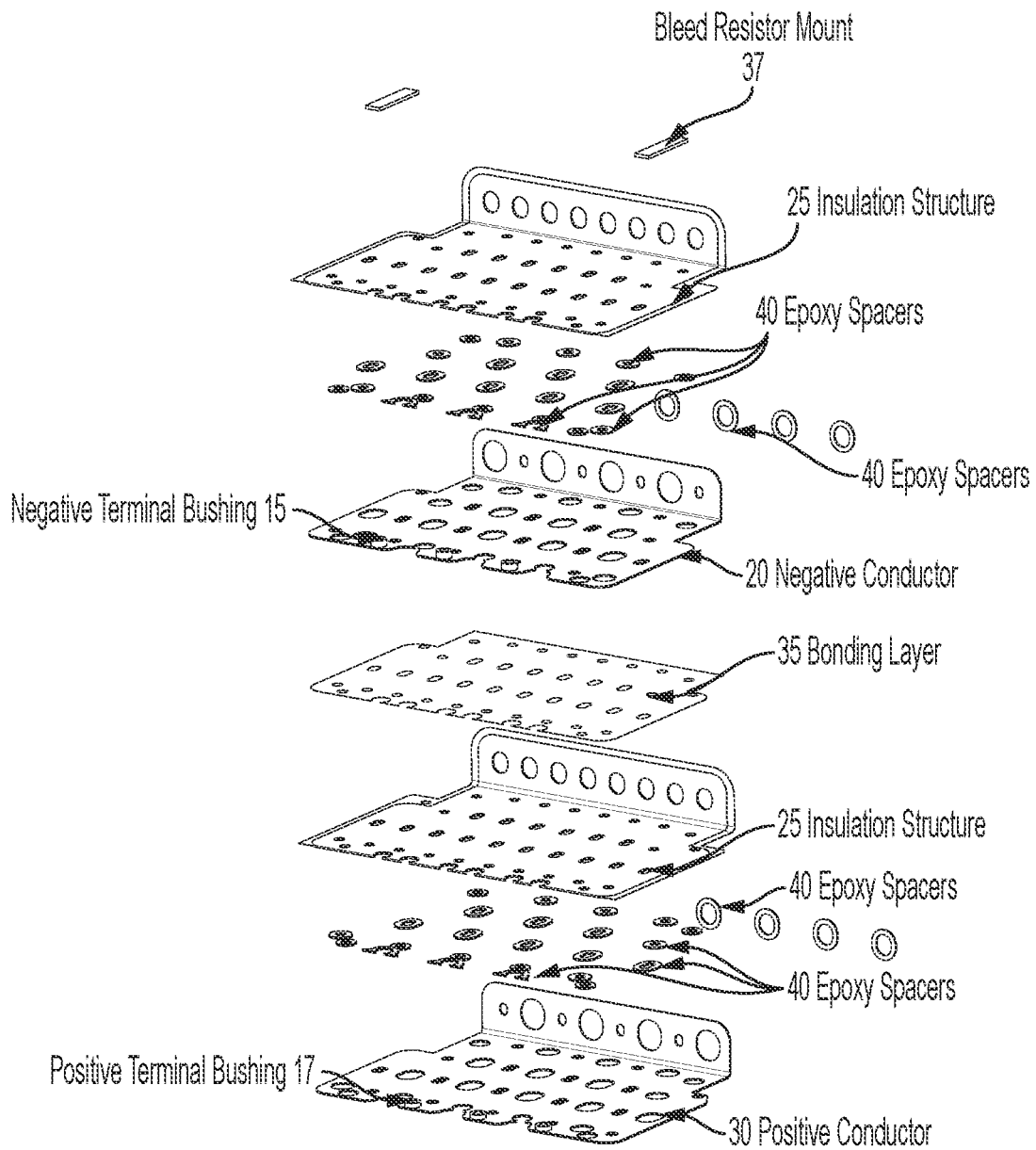
FIG. 5 illustrates an exploded view of the laminated DC busbar illustrated in FIG. 3 in accordance with aspects of the disclosure.

As shown in FIG. 5 which is an exploded view of the laminated DC busbar 10, the laminated DC busbar 10 has a negative conductor 20 and a positive conductor 30. Negative and positive refer to the voltage relative to chassis ground. Current in the positive conductor 30 flows in one direction and current in the negative conductor 20 flows in the opposite direction. Current in the positive conductor 30 induces a generally circular magnetic field in one direction and the current in the negative conductor 20 induces a generally circular magnetic field in the opposite direction. In places where the layers (conductors 20, 30) are laminated, e.g., overlap, if the conductors are positioned close enough, the magnetic fields cancel and the inductance of the busbar 10 is lower. However, in places where there is a gap or opening in one of the conductors and not the other and vice versa and there is no overlap, the magnetic fields do not cancel, and the inductance is higher.

Figure 18:
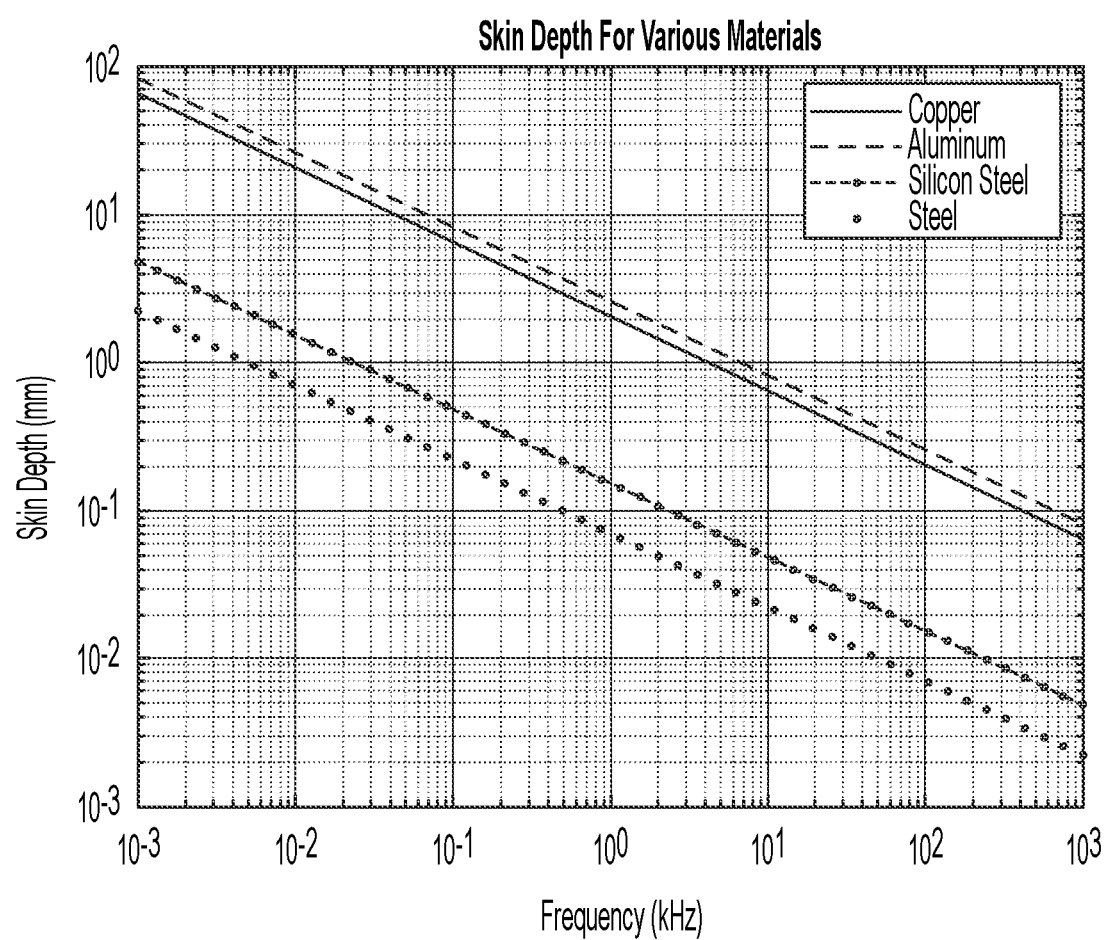
FIG. 18 illustrates a relationship between switching frequency and skin depth for examples of conductive materials.

Conductors 20, 30 may be made of a conductive material such as iron, lead, aluminum, gold, nichrome alloy, silver, graphene, tungsten, and copper. The material may be selected based on its conductivity and its skin depth. The thickness of the conductors 20, 30 and insulation structures 25 impacts the amount of cancelation of the induced magnetic fields; the thicker the layers, the less magnetic fields are canceled. The skin depth is the distance the current travels within a conductor in the depth direction. The skin depth is a function of the frequency (switching frequency and edge rates). There is an inverse relationship. FIG. 18 illustrates the relationship of frequency and the skin depth of various conductive materials. The wide bandgap semiconductor switches may have a switching frequency greater than 100 kHz. The material for the conductor may be selected having a lower skin depth at an application switching frequency and edge rate. For example, copper has a skin depth of less than 1 mm for a switching frequency of greater than 10 kHz. Therefore, when copper is used as the material for the conductors 20, 30, the thickness of each conductive layer may be set to less than 1 mm to utilize the cross-sectional area of the conductor.

Figure 4:
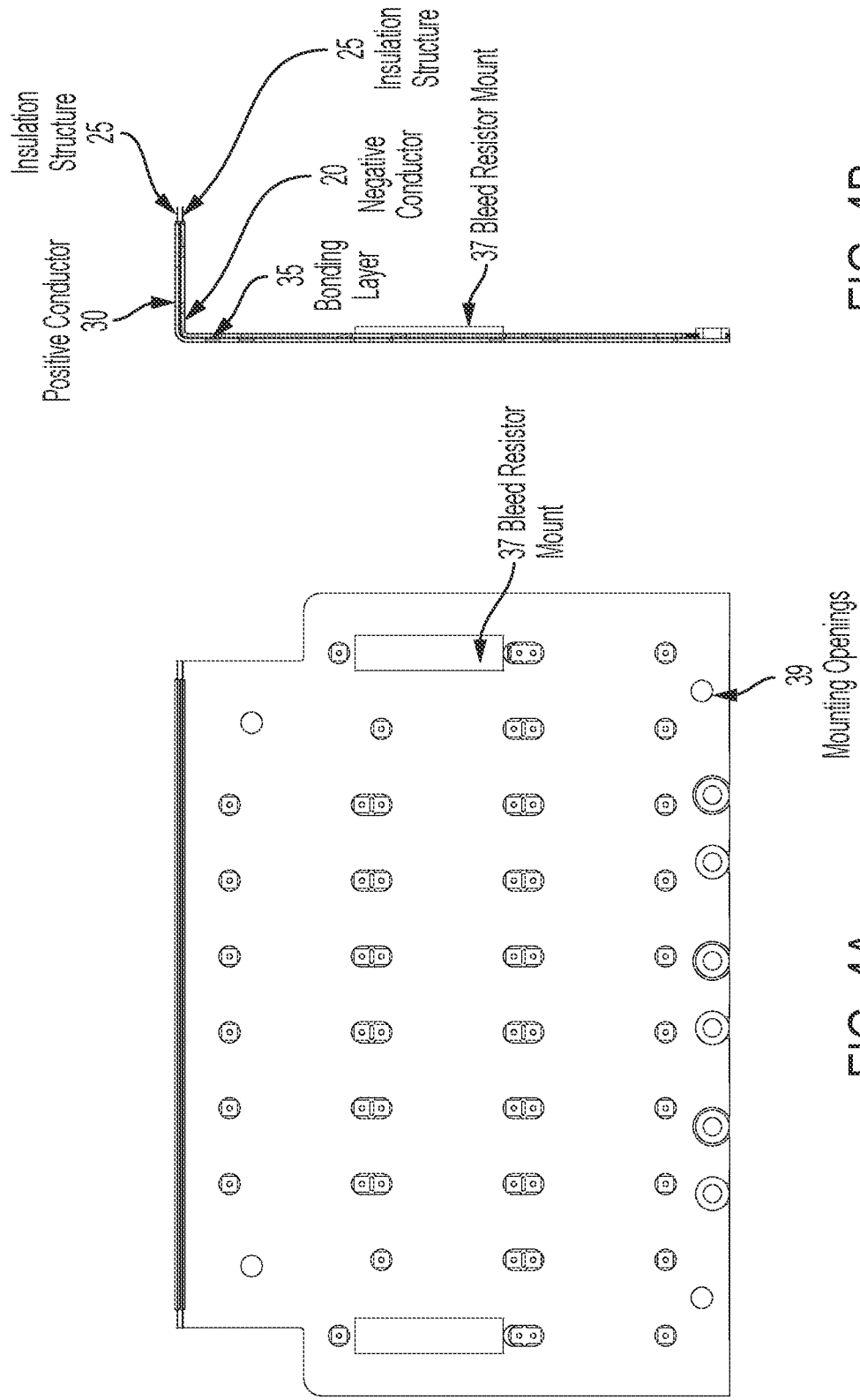
FIG. 4A illustrates a top view of the laminated DC busbar illustrated in FIG. 3
FIG. 4B illustrates a sectional view of the same busbar in accordance with aspects of the disclosure.
Figure 6:
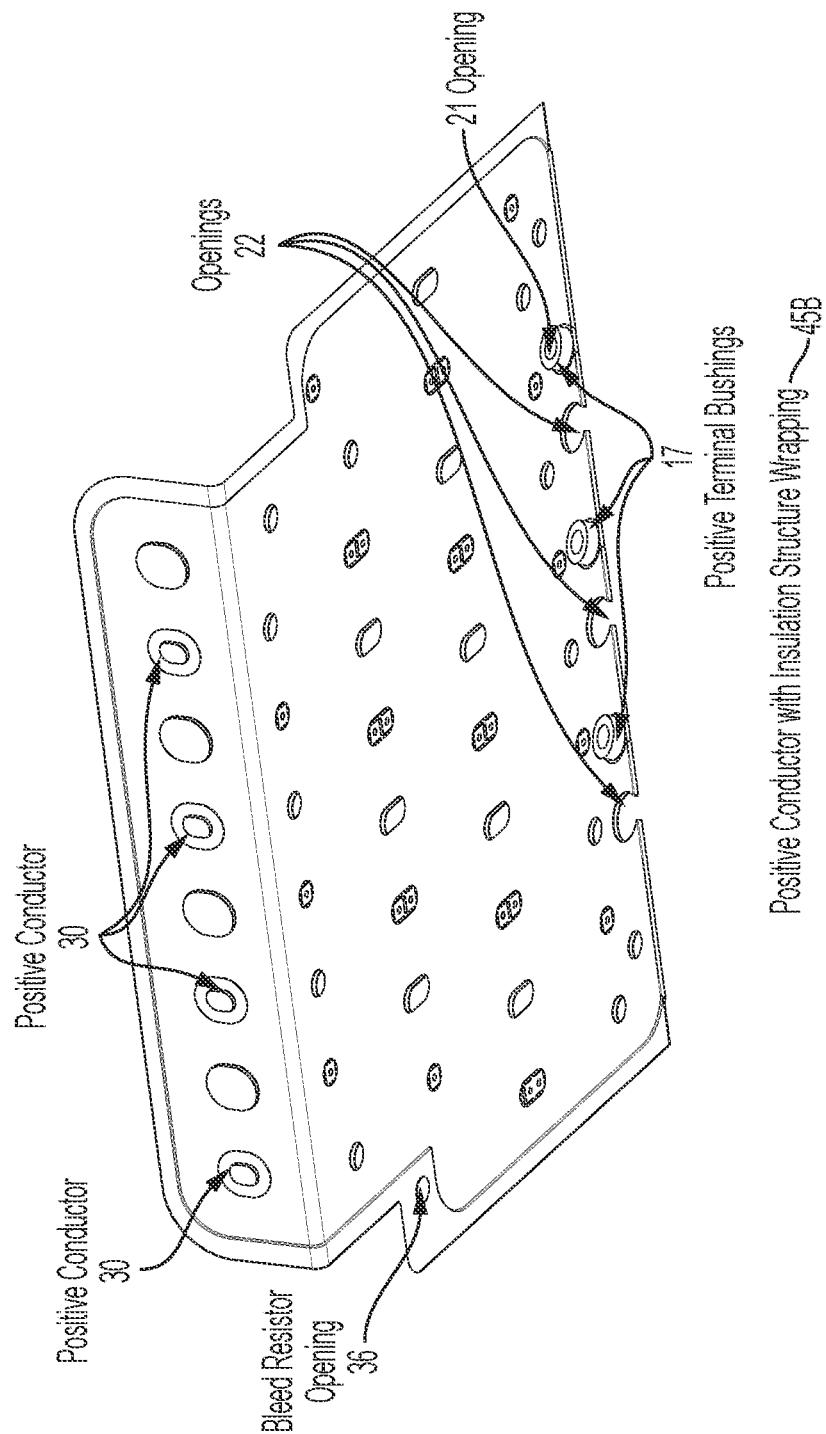
FIG. 6 illustrates an example of a positive conductor being wrapping in an insulation structure in accordance with aspects of the disclosure.
Figure 7:
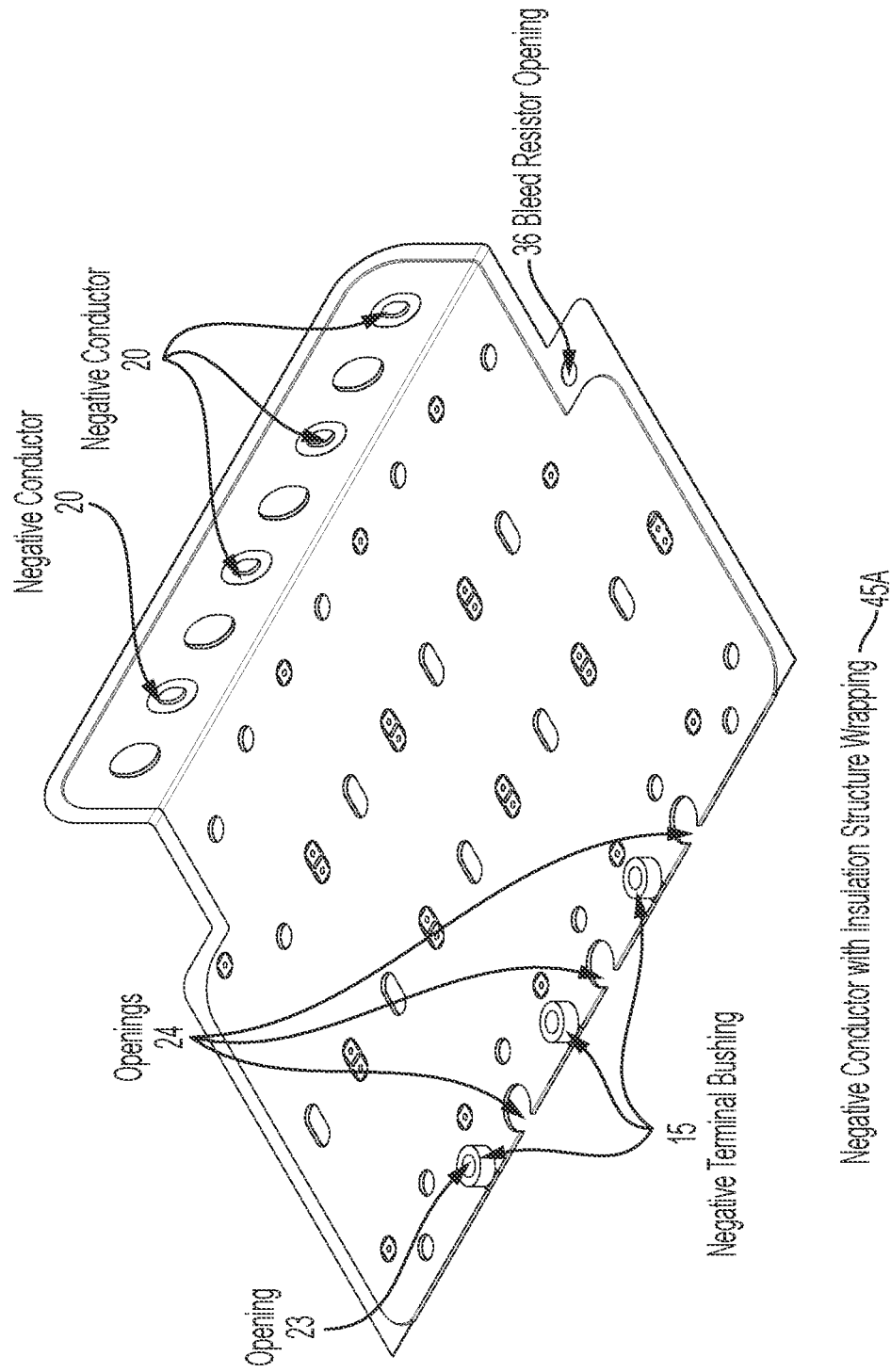
FIG. 7 illustrates an example of a negative conductor being wrapping in an insulation structure in accordance with aspects of the disclosure.
Figure 8:
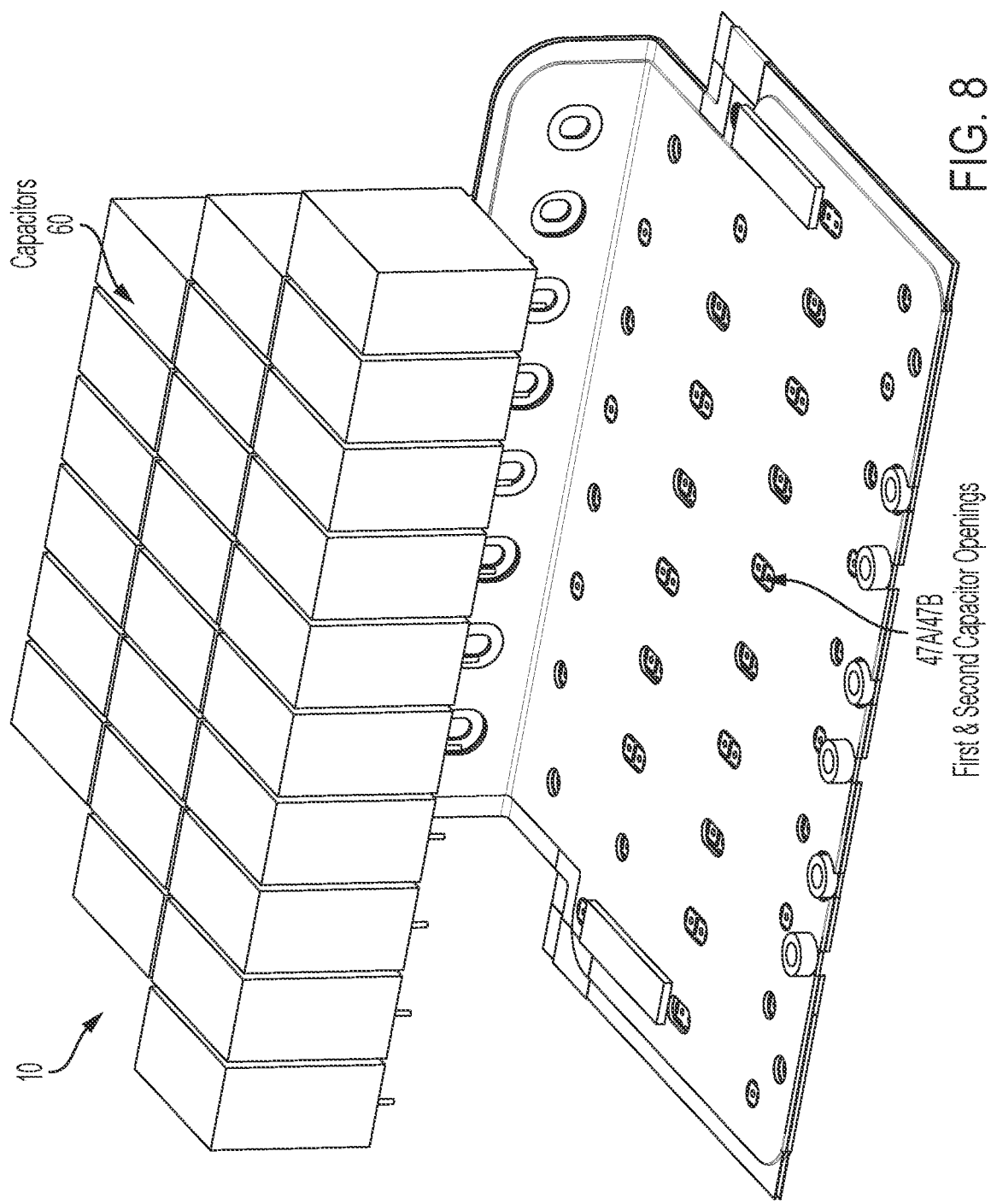
FIG. 8 illustrates an exploded view of the laminated DC busbar illustrating the capacitors and capacitor openings in accordance with aspects of the disclosure.
Figure 9:
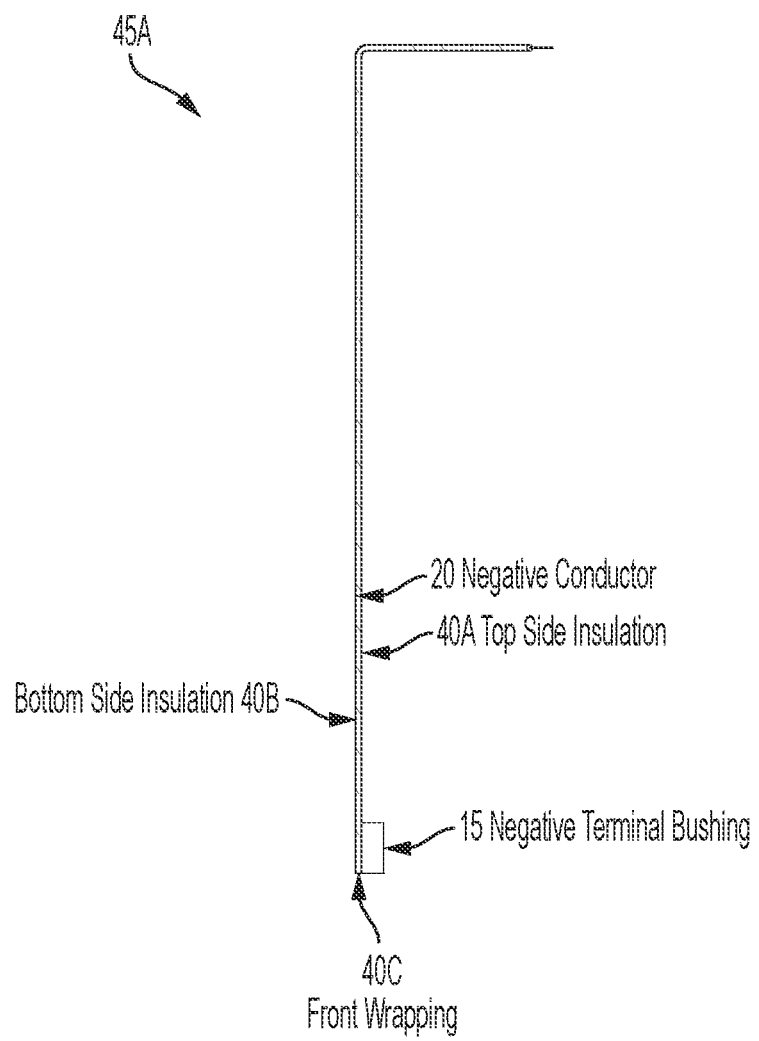
FIG. 9 illustrates a sectional view of the negative conductor wrapped in the insulation structure in accordance with aspects of the disclosure.

In an aspect of the disclosure, each conductor 20, 30 is surrounded by an insulator, e.g., an insulation structure 25, to electrical isolate each conductor 20, 30. The insulator structure 25 has a top side insulation 40A (shown in FIG. 9), bottom side insulation 40B (shown in FIG. 9) and front wrapping 40C (shown in FIG. 9). The insulation extends beyond the conductors 20, 30 such as shown in FIG. 4B. FIGS. 6 and 7 respectively illustrate the positive conductor wrapped with the insulation structure (collectively 45B) and the negative conductor wrapped with the insulation structure (collectively 45A). The overhang in of the insulation structure 25 is shown in FIGS. 6 and 7. In some aspects of the disclosure, the insulation structure 25 may be a tape such as a polyimide sheet with adhesive. The insulation structure 25 is not limited to a polyimide sheet or films, other insulating films such as polyvinyl fluoride (PVF), polyethylene terephthalate (PET), and polyester films may be used. The thickness of the layer is based on the electrical insulation needed for the application and the maintaining the conductors 20, 30 close to cancel the magnetic fields to keep the inductance low. In some aspects of the disclosure, the thickness of the sheet/film may be about 0.1 mm with about a 25 μm thick adhesive (when wrapped the total thickness is doubled to account for the top side insulation 40A and the bottom side insulation 40B).

In an aspect of the disclosure, each conductor 20, 30 is separately wrapped with the insulation structure 25. This separate wrapping allows the laminated DC busbar 10 to become closer to the positive and negative terminals 200/205 of the wide bandgap switching unit 15. This is because the front wrapping 40C may be flush with the edge of the conductor 20, 30. This reduces the space between adjacent conductors and thus reduces inductance at this interface.

The wrapped positive conductor 45B and the wrapped negative conductor 45A are connected using two-sided bonding (bonding layer 35) as shown in FIG. 4B. In an aspect of the disclosure, the bonding layer 35 may be about 0.3 mm thick.

Once again, in order to have the opposite magnetic fields induced in the conductors 20, 30 cancel, the thickness of the insulations is thin to have the conductors 20, 30 close to each other.

The first portion 11 has openings 19 to connect the laminated DC busbar 10 to the DC backplane 100. The openings 19 are where respective openings in the layers, e.g., opening in the negative conductor 20, the insulation structure 25, bonding layer 35, positive conductor 30 align. Openings in each layer as shown in the exploded view of FIG. 5. The openings 19 are dimensioned to receive a connection hardware 1000A to mount the laminated DC busbar 10 to the DC backplane 100. The connection hardware 1000A may be a bolt threaded into a nut-plate 1005A. The connection hardware 1000A both mechanically connects the laminated DC busbar 10 to the backplane 100 and electrically connects the corresponding conductors.

The openings of the insulation structure 25 which corresponds to the openings 19 may be wider. The difference in the size enables a respective conductor to be exposed by the opening in the insulation structure 25 to make the electrical contact via opening 19.

In an aspect of the disclosure, the conductors 20, 30 surround the opening 19 and the openings of the insulation structure. This is to reduce an area where the conductors 20, 30 are not aligned. In an aspect of the disclosure, the conductor (20 or 30) which is exposed by the opening in the insulation system 25 alternates between the openings 19 such as shown in FIGS. 6 and 7. For example, as shown in FIG. 6, the positive conductor 30 is exposed in the first, third, fifth and seventh opening, whereas as shown in FIG. 7, the negative conductor 20 is exposed in the second, fourth, sixth and eight opening. The size of the openings in the conductor 20, 30 in the first portion 11 vary based on whether the conductor will electrically connect with the corresponding conductor in the DC backplane 100. As shown in the exploded view in FIG. 5, each conductor 10, 20 has alternating size openings in the first portion 11. The openings have a first size larger than the opening in the insulation structure 25 and a second size smaller than the opening in the insulation structure depending on the connection and exposure.

The exposure is seen in FIGS. 6 and 7 as thin rings with a central opening (e.g., opening 19). In this area due to the different sized openings, the conductors 20, 30 do not face each other and are not aligned and thus are a source of an increase in the inductance of the laminated DC busbar 10. Thus, in an aspect of the disclosure, the amount of the exposure (e.g., offset) is kept to a minimum needed to create the electrical connection between the respective conductor and its corresponding conductor in the DC backplane and clearance. Epoxy spacers 40 are positioned to face the exposed conductors. The epoxy spacers 40 maintain a fixed distance between the conductors 20, 30 and also provide a minimum creepage distance. Specifically, the epoxy spacers 40 are positioned in the opening in the conductor having the first size. The epoxy spacers 40 also allow the openings 19 and the first size openings to be smaller than without the same. This reduces the increase in inductance. The increase in inductance is also reduced because the conductors 20, 30 extends beyond the openings 19 (surrounds) and thus maximizes the conductor overlap and alignment. This contrasts with using connection tabs projecting from the respective conductors where there is a large amount of non-overlap.

The plurality of openings 19 are used to connect the laminated DC busbar 10 to the backplane 100. The number of openings is at least three. However, in the example of the busbar 10 depicted in the figures, there are eight openings. The more openings 19, the inductance of the laminated DC busbar 10 is lower. This is because each time the conductors 20, 30 do not overlap is a source of inductance, however, when the inductance is paralleled, the overall inductance is divided. Therefore, using X openings 19 the inductance caused by the offset at each opening is divided by X to determine the overall increase caused.

The second portion 13 has a plurality of openings for connecting the wide bandgap switching unit 15 to the laminated DC busbar 10. The openings are along the edge of the laminated DC busbar 10 facing the wide bandgap switching unit 15. The openings are paired to enable pairs of the terminals 200/205 of the wide bandgap switching unit 15 to be connected to the laminated DC busbars 10. The number of pairs of openings depends on the number of phases of the wide bandgap switching unit 15. For example, as shown in the figures, the wide bandgap switching unit 15 has 3 phases and thus three pairs of terminals 200/205. In the example of a laminated DC busbar 10, there are three-pairs of openings along the edge of the second portion 13 of the laminated DC busbar 10. More specifically, as shown in FIG. 6, the wrapped positive conductor 45B has three openings 22. The positive conductor 30 and the insulation structure 25 have matched openings to form openings 22. Similarly, the negative wrapped conductor 45A has three openings 24. The negative conductor 20 and the insulation structure 25 has matched openings to form openings 24.

Openings 22 and 24 alternate and are not aligned as viewed from above.

The wrapped positive conductor 45B also has three openings 21 adjacent to the three openings 22. The three openings 21 is smaller than openings 22. The positive conductor 30 and the insulation structure 25 have openings to form openings 21. The wrapped negative conductor 45A also has three openings 23 adjacent to the three openings 24. The three openings 23 is smaller than openings 24. The negative conductor 20 and the insulation structure 25 have openings to form openings 23.

Positive terminal bushings 17 are attached to the positive conductor 30. The positive terminal bushings 17 may be soldered or mechanically attached, such as interference fit, or swaged into the positive conductor 30. For example, three positive terminal bushings 17 (corresponding to three positive terminals 200 of the wide bandgap switching unit 15) extend from the surface of the positive conductor 30. The bushings 17 surround the openings 21. The openings 21 are dimensioned for connection hardware 1000B to be inserted to mount the wide bandgap switching unit 15 to the laminated DC busbar 10.

Negative terminal bushings 15 are attached to the negative conductor 20. The negative terminal bushings 15 may be soldered or mechanically attached, such as interference fit, or swaged into the negative conductor 20. For example, three negative terminal bushings 15 (corresponding to three negative terminals 205 of the wide bandgap switching unit 15) extend from the surface of the negative conductor 20. The bushings 15 surround the openings 23. The openings 23 are dimensioned for connection hardware 1000B to be inserted to mount the wide bandgap switching unit 15 to the laminated DC busbar 10. Openings 21 and 23 also alternate.

The bushings 15, 17 may be made of an electrically conductive material. FIG. 3 illustrates three pairs of negative and positive terminal bushings 15, 17. In an aspect of the disclosure, the openings 24 allow for the positive terminal bushings 17 to be exposed though the negative conductor 20 and contact the corresponding positive terminal 200 of the wide bandgap switching unit 15. In an aspect of the disclosure, the openings 24 have epoxy spacer 40 to provide a minimum creepage distance. Once again, the epoxy spacers 40 allow for the openings 24 to be smaller which maintain a higher level of conductor overlap and which reduces the inductance of the laminated DC busbar 10.

Openings 22 also have epoxy spacers 40 to provide a minimum creepage distance such that the connection hardware 1000B does not contact the positive conductor 30.

Figure 16:
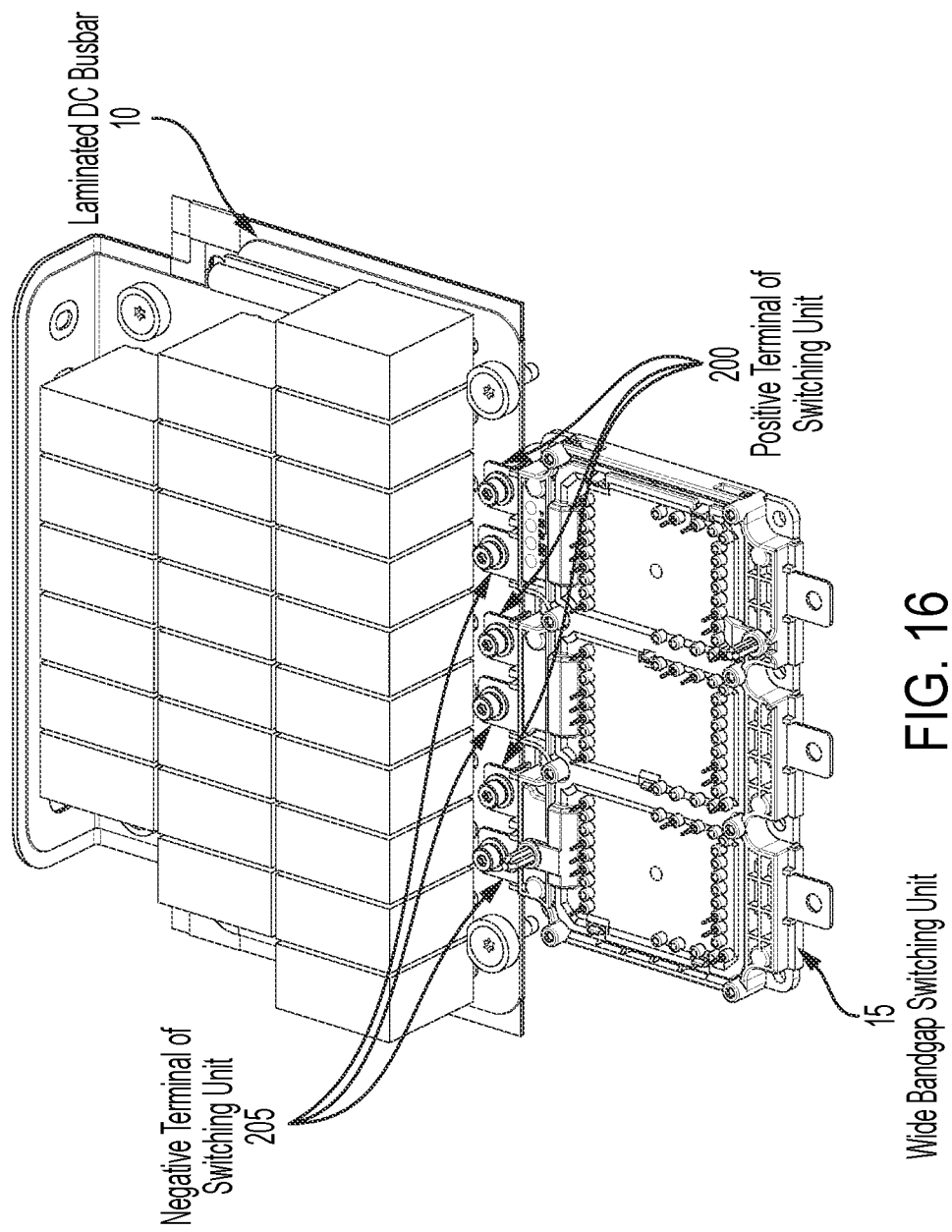
FIG. 16 illustrates an example of a laminated DC busbar connected to a wide bandgap switching unit in accordance with aspects of the disclosure.
Figure 17:
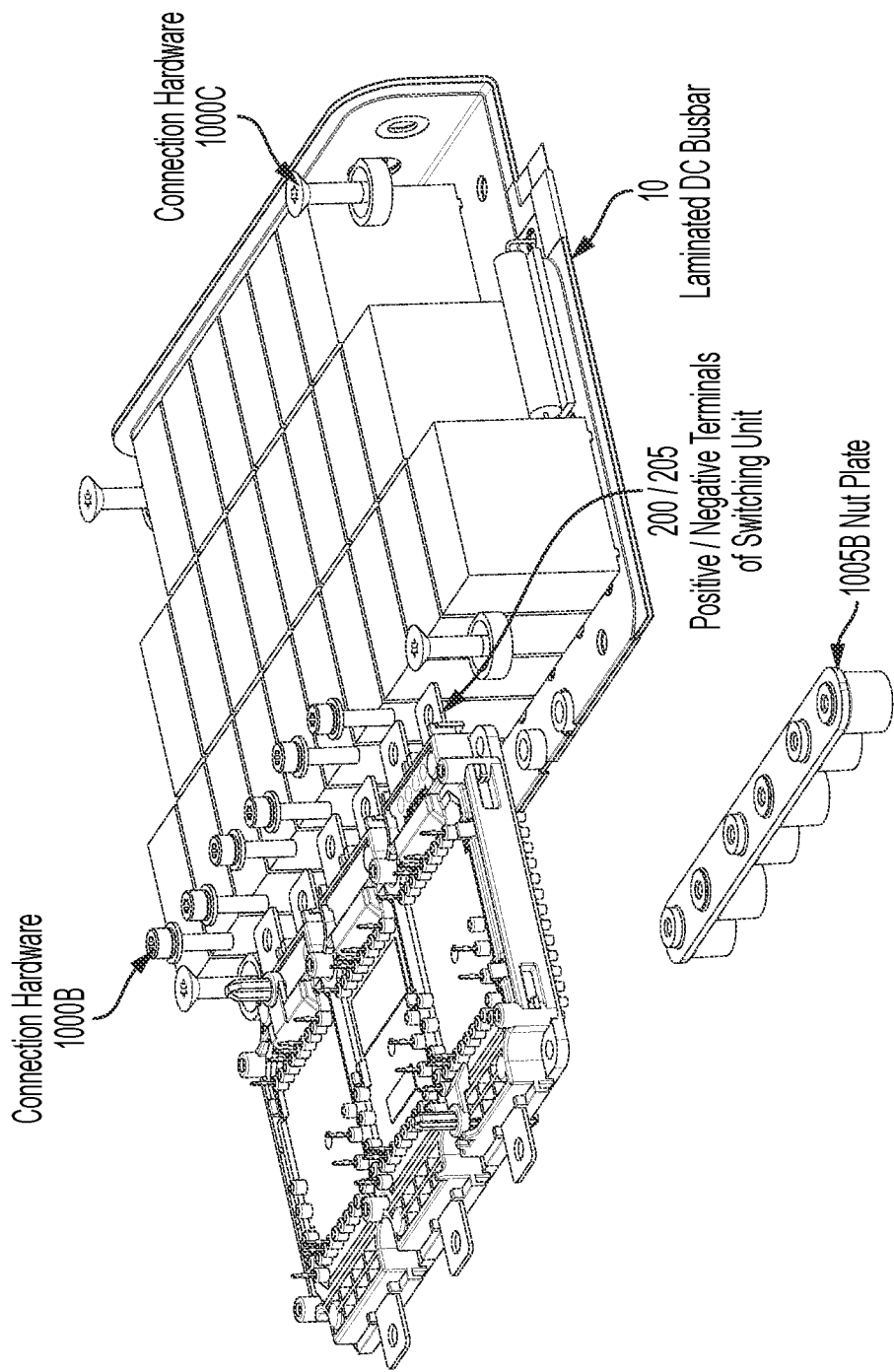
FIG. 17 illustrates an exploded view of an example of a connection of the laminated DC busbar and the wide bandgap switching unit in accordance with aspects of the disclosure.

In some aspects of the disclosure, the openings 22, 24 extend to the edge of the laminated DC busbar 10 to allow for the wide bandgap switching unit 15 to be mounted close to the laminated DC busbar 10 (as shown in FIGS. 16 and 17) using a nut plate 1005B. While the bushings 15, 17 are surrounding by the respective conductors 20, 30, the bushings, 15, 17 are positioned close to the edge (such as shown in FIGS. 4B. and 9) as well to shorten the distance between the laminated DC busbar 10 and the wide bandgap switching unit 15.

The bushings 15, 17 are a source of inductance. This is because current will flow through the bushings which has a substantially cylindrical shape, and a magnetic field is induced. The induced magnetic field may not cancel. Thus, the longer the bushings 15, 17 are, the higher inductance of the laminated DC busbar 10. In accordance with aspects of the disclosure, the bushings 15, 17 are a minimum height to achieve electrical connection with a corresponding terminal 205, 200.

Figure 10A:
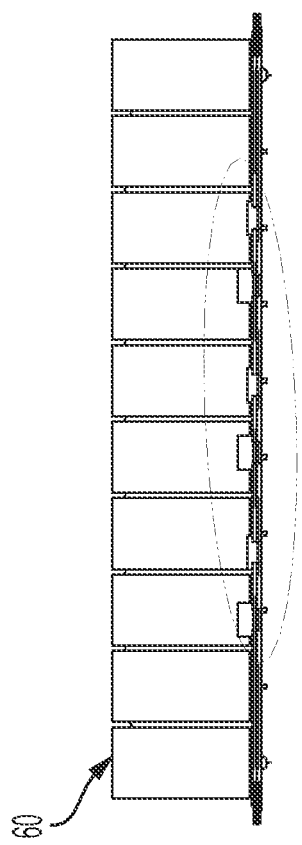
FIGS. 10A and 10B illustrate a front view of the laminated DC busbar illustrated in FIG. 3 showing the bushings for electrically connecting the laminated DC busbar with the wide bandgap switching unit in accordance with aspects of the disclosure, where
Figure 10B:
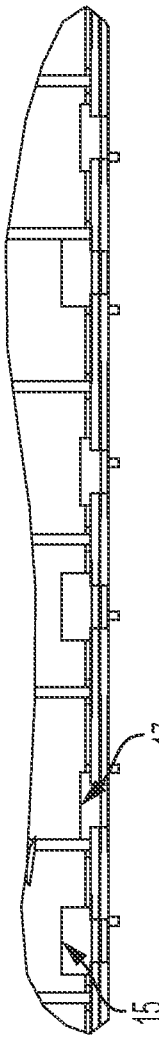

In some aspects of the disclosure, the height of the mounting tabs (terminals 200/205) may be offset. Thus, the heights of the bushings 15, 17 may be different. For example, the height of the bushings 17 are from the top of the positive conductor 30 to the bottom of the positive terminals 200 of the wide bandgap switching unit 15. Similarly, the heights of the bushings 15 are from the top of the negative conductor 20 to the bottom of the negative terminals 205 of the wide bandgap switching unit 15. At least FIGS. 3, 10A, 10B illustrate an example of the height difference in bushings 15, 17. For example, as shown in FIG. 10B, the positive bushing 17 extends from the positive conductor 30 to just above the negative wrapped conductor 45A whereas the negative bushing 15 extend beyond the height of the positive bushing 17.

The use of openings 21-24 (and bushings 15, 17) instead of projecting tabs from respective conductors reduces the inductance of the laminated DC busbar 10 as the overlap between conductors 20, 30 is larger than using tabs.

The second portion 13 of the laminated DC busbar 10 also has capacitance (capacitors 60). The total value of capacitance needed is based on the specific application for each module and the MPCS. Each capacitor may be a source of inductance. This is because capacitors need to have openings in the conductors 20, 30 for connection to the conductors 20, 30. Any opening in the conductors 20, 30 for electrical connection leads to conductor 20, 30 offset and one conductor is connected and the other is insulated. Additionally, each capacitor has two leads (pins). Leads will protrude from the bottom of the busbar 10 to allow for soldering. However, each protrusion (lead) is a conductor and increase inductance because current flows and the magnetic field is induced. While an increase in pin count may lead to an increase in inductance, since more capacitors requires more openings (each opening being a source of inductance), since the inductance divides, more capacitors reduce in a lower overall inductance for the laminated DC busbar 10.

Each conductor 20, 30 has two different type of capacitor openings 47A, 47B arranged in rows. The first capacitor opening 47A is a larger opening than the second capacitor opening 47B. The second capacitor opening 47B is configured for the capacitor to electrically connect to the respective conductor. In an aspect of the disclosure, the first capacitor opening 47A and the second capacitor openings 47B alternate within a row and between rows.

Figure 11B:
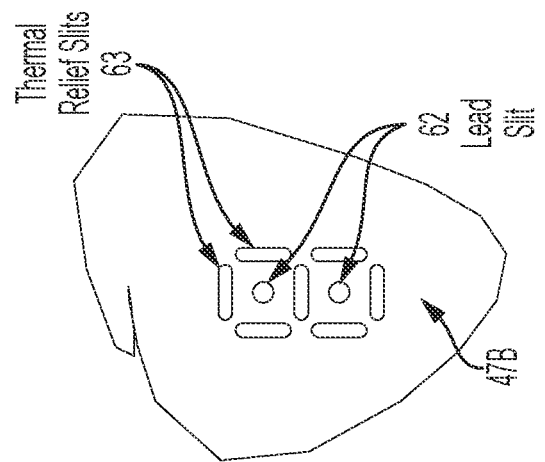
FIG. 11B is an enlarged view of the region within the dotted and dashed circuit in FIG. 11A to highlight lead slits and thermal relief slits in accordance with aspects of the disclosure.
Figure 11A:
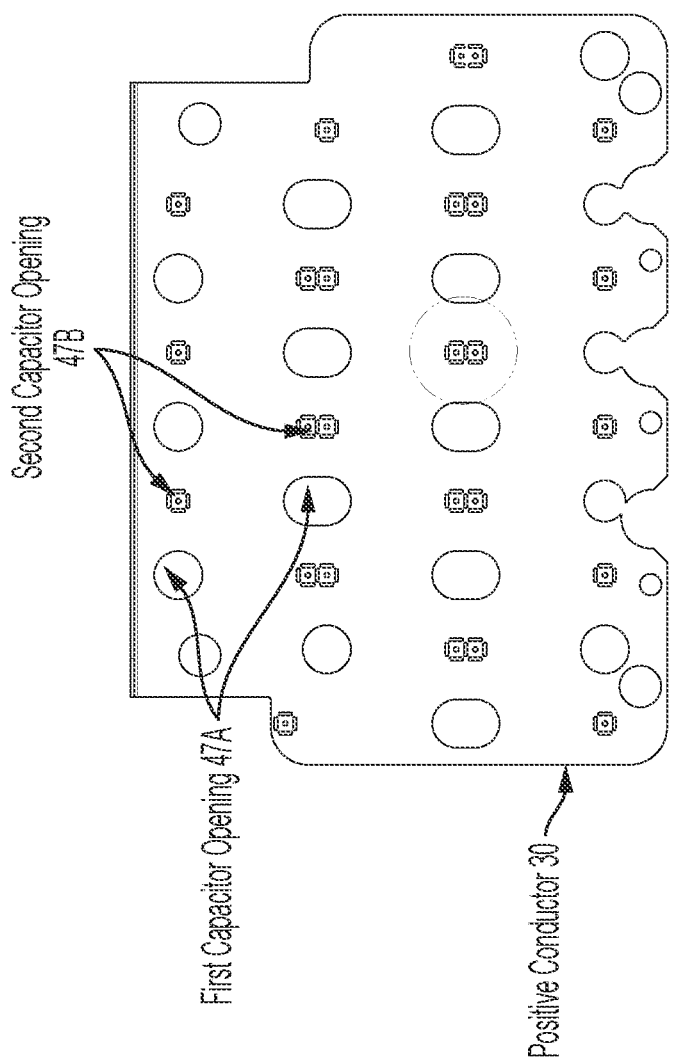
FIG. 11A illustrates a top view of the positive conductor in accordance with aspects of the disclosure, the capacitor openings are shown

FIG. 11A illustrates a bottom view of the positive conductor 30. As shown, there are four rows of capacitor openings 47A, 47B. The openings 47A, 47B in the middle two rows are configured for two leads and the openings 47A, 47B in the outer rows are configured for one lead. A capacitor spans two rows: one lead attached to one row and the other lead attached to another adjacent row. The polarity of the capacitors may alternate which is why the openings 47A, 47B alternate. FIG. 11B is an expanded view of one second capacitor opening 47B. This second capacitor opening 47B is for two leads. The opening 47B has two lead slits 62. The diameter of the lead slits 62 is based on the diameter of the lead. The lead of the capacitor is soldered to the respective conductor around the lead slit. The opening 47B also has thermal relief slits 63 (relief spokes). These thermal relief slits 63 are for aiding in the soldering of the capacitors 60. The slits 63 control the amount of heat dissipating.

The spacing between lead slits 62, the number and size of the relief slits 63 may be application specific based on the type of capacitors and size of the capacitors used.

Each insulation structure 25 has corresponding openings for the capacitors. Since the same insulation structure 25 may be used for both the negative conductor and the positive conductive, the corresponding openings in the insulation structure 25 may have the same size as openings 47A.

In an aspect of the disclosure, the capacitors 60 are film capacitors. Film capacitors have high current carrying capability and improved safety. The film capacitors are self-healing and will not explode when exposed to a potential over voltage. For example, the film capacitors may be from TDK Corporation or Kemet. These capacitors 60 have short leads that also limit an increase in the inductance. In an aspect of the disclosure, the capacitors 60 may be connected in parallel to limit an increase in the inductance. For each, each capacitor 60 may have an inductance of 12 nH for a certain capacitance (capacitor parasitics drive inductance into the loop). However, when multiple capacitors are connected in parallel the inductance also divides. For example, when 24 capacitors (each having 12 nH of inductance) are connected in parallel, the capacitor assembly has a total inductance of 0.5 nH. 24 capacitors are an example of a number of capacitors used to reduce the total inductance; however, the number of capacitors used may be based on the application and the total capacitance needed and current rating of each capacitor. The number of capacitors may also be based on a size of the chassis and module.

The laminated DC busbar 10 also has mounting openings 39 (on the second portion 13) as illustrated in FIG. 4A. The mounting openings 39 are positioned near the four corners of the second portion 13. The mounting openings 39 are for mounting the laminated DC busbar 10 to a respective chassis of a module (not shown). Connection hardware 1000C (as shown in FIG. 17) may be inserted into the mounting openings 39 to mount a laminated DC busbar 10 to a chassis.

As illustrated in FIGS. 4A and 4B, the laminated DC busbar 10 also may have two bleed resistor mounts 37. The bleed resistor mounts 37 may be mounted on the negative conductor 20. The bleed resistors (shown in FIG. 17, but not labeled) provide a means to discharge the capacitors 60 when the capacitors 60 are not power. The bleed resistors provide a safety mechanism. The bleed resistance may be positioned between the positive and negative of the capacitors 60. The physical positioned on the laminated DC busbar 10 in the figures is only an example. The positive conductor 30 and the negative conductor 20 of the laminated DC busbar 10 having corresponding openings 36 for the leads of the bleed resistors.

In an aspect of the disclosure, the semiconductor switches in the wide bandgap switching unit 15 may be silicon carbide (SiC) or gallium nitride (GaN) field effect transistors (FETS). Both semiconductor switches have the capability for switching up to 100 kHz. The actual switching frequency of the semiconductor switches may be application specific and designed to achieve a target power. In an aspect of the disclosure, each invertor module in the MPCS may have the same switching frequency. However, in other aspects, the switching frequency may be different for different types of inverter modules. For example, an inverter module outputting a single phase may have a different switching frequency than an inverter module outputting three phases.

Faster transitions in switches leads to lower losses. Additionally, the higher switching frequency allows for smaller magnetics in the MPCS. Both SiC and GaN FETs are able to handle a high VDC. For example, SiC may receive up to 1700 VDC whereas GaN FET may receive up to 600V.

To mount the wide bandgap switching unit 15 to the laminated DC busbar 10, the positive terminals 200 of the switching unit 15 are aligned with the positive terminal bushings 17 and the negative terminals 205 of the switching unit 15 are aligned with the negative terminal bushings 15. The positive terminals 200 and the negative terminals 205 have openings for mounting the switching unit 15 to the laminated DC busbar 10 (shown in FIG. 17). These openings are dimensioned to receive the connection hardware 1000B. These openings are aligned with openings 21, 23. When aligned, the positive terminals 200 are placed in contact with the positive terminal bushings 17 and the negative terminals 205 are placed in contact with the negative terminal bushings 15. The mounting hardware 1000B (shown in FIG. 17) is inserted into the openings in terminals, openings 21, 23 and into the nut plate 1005B and torqued down. FIG. 16 illustrates an example of the wide bandgap switching unit 15 mounted to the laminated DC busbar 10.

The laminated DC busbar 10 and the wide bandgap switching unit 15 as described herein may have a round trip inductance between the capacitors 60 and the wide semiconductor switching unit 15 of less than about 1.5 nH. In other aspects, the und trip inductance between the capacitors 60 and the wide semiconductor switching unit 15 may be about 1.0 nH.

The inductance may be measured using an LCR meter.

To measure the inductance, the positive terminals 200 of the wide bandgap switching unit 15 may be shorted using wires. The negative terminals 205 of the wide bandgap switching unit 15 may also be shorted using wires. Then the shorted positive terminals 200 and the shorted negative terminals 205 may be shorted via wires. Additionally, the positive leads (terminals) of all of the capacitors 60 may be shorted using wires. Similarly, the negative leads (terminals) of all of the capacitors 60 may be shorted. The LCR meter may be connected to the shorted negative leads of the capacitors 60 and the shorted positive leads of the capacitors 60 and a known current/voltage applied to the same. The current may have a frequency representative of the operating conditions. For example, the frequency may be about 20 KHz. The LCR meter measures the voltage/current resulting therefrom. However, since the inductance is small, each wire used to short also has inductance and the inductance of each wire has to be offset or compensative for to arrive at the round-trip inductance between the capacitors 60 and the wide bandgap switching unit 15. In an aspect of the disclosure, the LCR meter may measure the voltage/current across each wire used to short and subtract from the total determined above. The resulting magnitude and phase of the voltage developed at the injecting node defines the inductance by the relationship $V=I*(R+jwL)$ (or magnitude of the current).

For example, for the configuration shown in FIG. 17 where there are three positive terminals 200 and three negative terminals 205 and 24 capacitors, the three positive terminals 200 may be shorted with two wires and the three negative terminals 205 may be shorted with two wires. The shorted positive terminals 200 and the shorted negative terminals 205 may be shorted with one wire. Five wires may be used to short the wide bandgap switching unit 15. The positive leads of the 24 capacitors may be shorted with 23 wires and the negative leads of the 24 capacitors may be shorted with 23 wires. Thus, 46 wires may be used for the capacitors 60. Thus, 51 wires may also contribute to the measured inductance. The current/voltage of the 51 wires should be compensated for to determine the round-trip inductance between the capacitors 60 and the wide bandgap switching unit 15 (e.g., subtracted).

In other aspects, the inductance may be determined via finite element simulation.

Figure 2C:
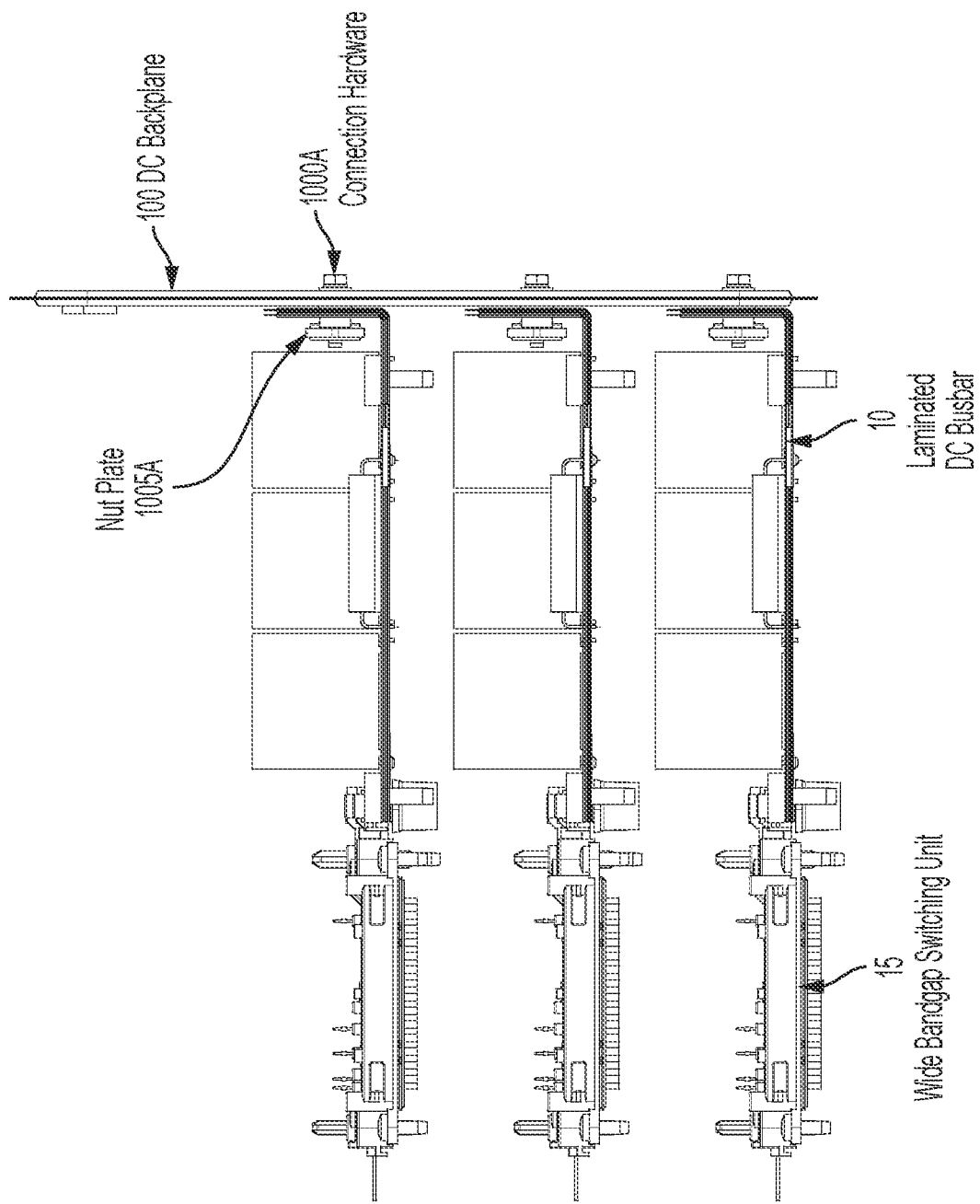
Figure 12:
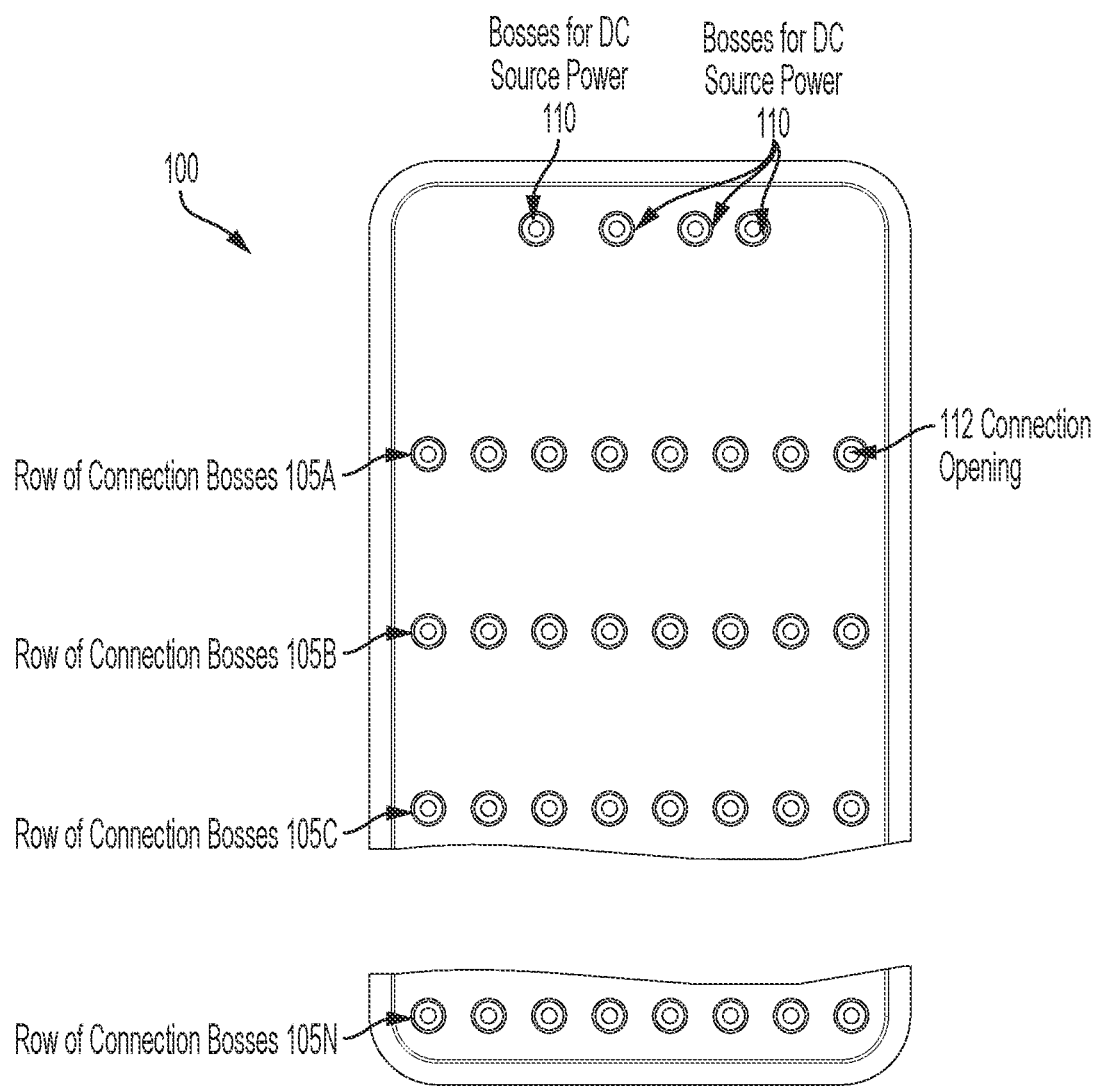
FIG. 12 illustrates a front view of a DC backplane in accordance with aspects of the disclosure.

In accordance with aspects of the disclosure, the DC backplane 100 also has a super low inductance. FIG. 12 illustrates an example of a DC backplane 100 in accordance with aspects of the disclosure. As described above, a plurality of laminated DC busbars 10, where the number is N may be mounted to the DC backplane 100. Accordingly, the DC backplane 100 has a plurality of rows of connection bosses 105, where the number of rows is N. The DC backplane 100 has a plurality of connection openings 112. The connection openings 112 are within the central portion of the bosses 105 and extend through the DC backplane 100. The connection openings 112 are dimensioned to receive connection 1000A (as shown in FIGS. 2B and 2C) to mechanically connect each laminated DC busbar 10 to the DC backplane 100 and to electrically connect corresponding conductors.

The number of rows connection bosses 105N may be based on an application for the MPCS and needed inverter modules. For example, boss rows 105A-105C may be used for three single phase inverter modules. Another boss row 105N may be used for a three-phase inverter module.

The number of openings 112 in each row equals the number of connection openings 19 on the first portion 11 of the laminated DC busbar 10. As described above, in aspects of the disclosure, the number of openings limits the inductance of the busbar system 1 as each opening is a source of inductance because conductors are not aligned (laminated) in the opening 19, 112 and therefore, the magnetic fields do not cancel in this area. However, since the inductance is in parallel, the inductance divided. Therefore, the more openings 19, 112, the overall inductance is less. In accordance with aspects of the disclosure, there may be at least three openings 112. In the example, DC backplane 100 shown in the figures (e.g., FIGS. 12 and 13), has 8 openings 112 in each row of bosses.

Figure 13:
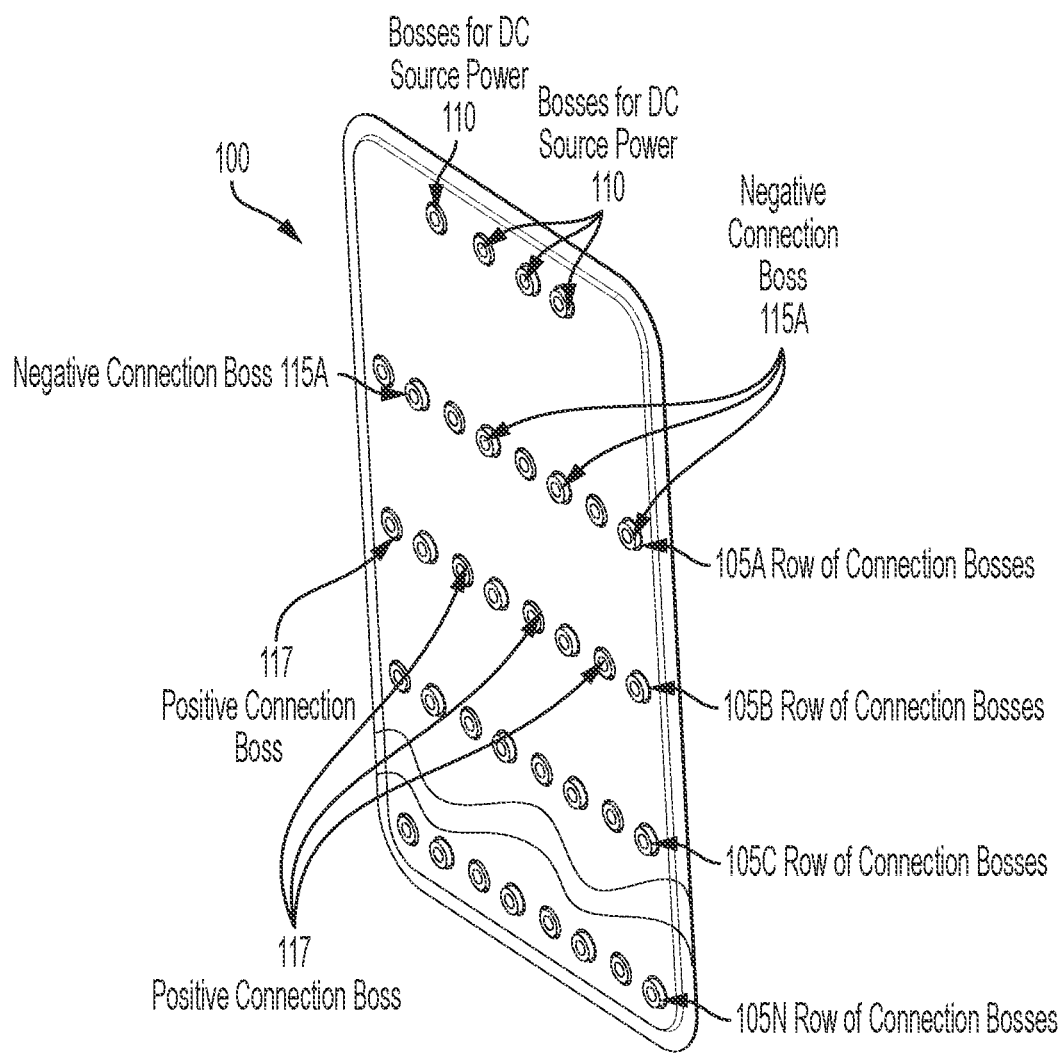
FIG. 13 illustrates a perspective view of an example of DC backplane in accordance with aspects of the disclosure.

The exposed bosses include negative connection bosses 115A and positive connection bosses 117 as shown in FIG. 13.

The negative connection bosses 115A are for connecting negative conductors in the DC backplane 100 and the laminated DC busbar 10 and the positive connection bosses 117 are for connecting positive conductors in in the DC backplane 100 and the laminated DC busbar 10.

The DC backplane 100 may be connected to additional modules via bosses 110 (to receive DC source power). For example, a DC interface module may be directly connected to the DC backplane 100 via the bosses 110. As shown in FIG. 13, there are two positive bosses (110) and two negative bosses (110). An external battery (such as a battery in a vehicle) may be connected to an DC interface in the DC interface module to supply power to the DC backplane 100 and in turn to the inverter modules.

In other aspects, extended DC busbars may be mounted to the DC backplane 100 via the bosses 110. For example, a positive extended busbar may be connected to the two positive bosses (110) and a negative extended busbar may be connected to the two negative bosses (110). DC busbars within a junction module and a DC filter module may connected to the positive extended and negative extended busbars. External chargers may be connected to interfaces in each the junction module and/or the DC filter module to supply power to the DC backplane 100.

Figure 14:
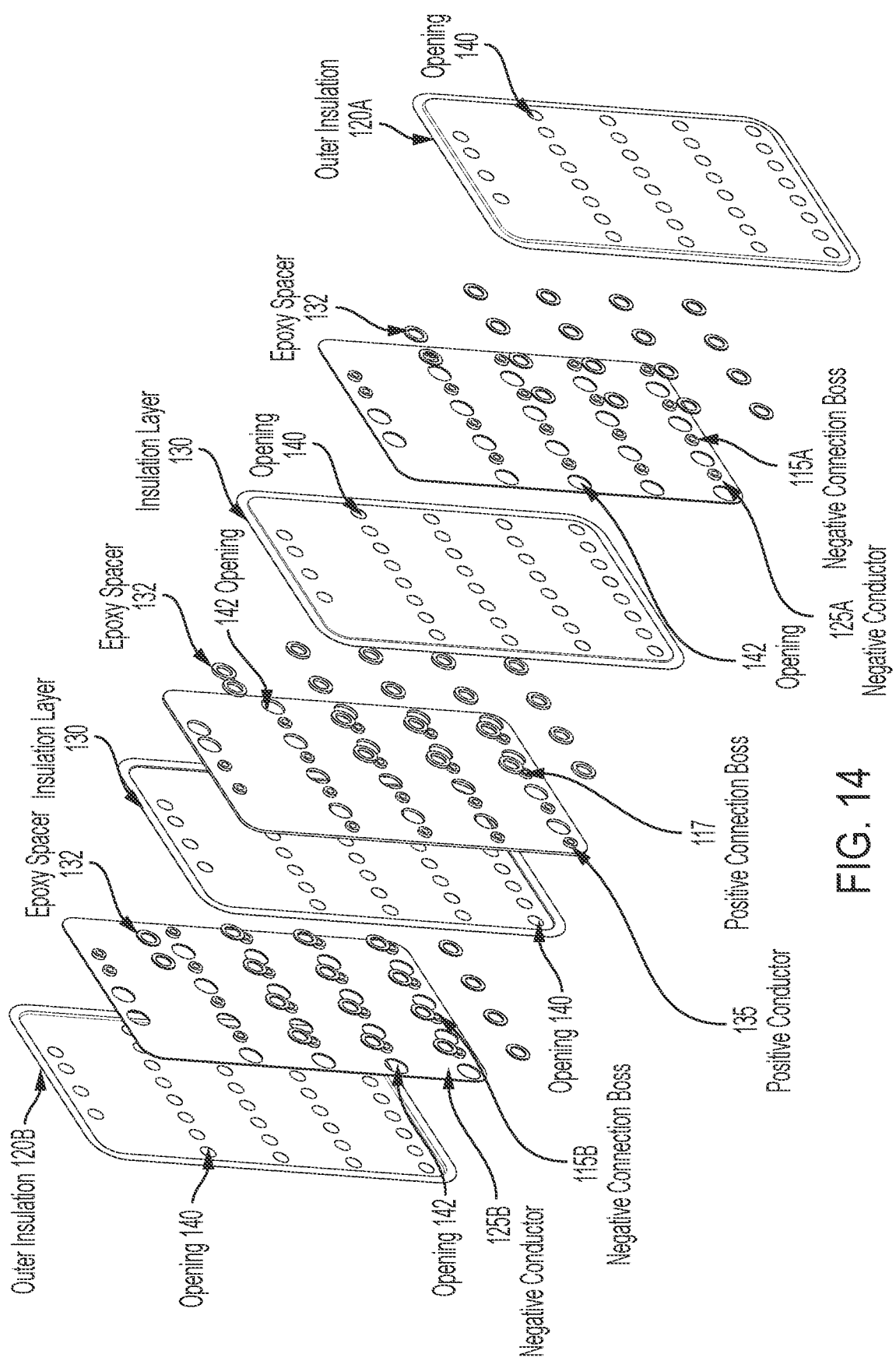
FIG. 14 illustrates an exploded view of an example DC backplane in accordance with aspects of the disclosure.

FIG. 14 illustrates an exploded view of an example of a DC backplane 100 in accordance with aspects of the disclosure. The DC backplane 100 may comprise three conductive layers: two negative conductors 125A and 125B (two negative layers) and a positive conductor 135 (positive layer). The negative conductors 125A and 125B may be positioned on opposite sides of the positive conductor 135.

The conductors 125A, 125B and 135 may be made of the same conductive material as conductors 20, 30 in the laminated DC busbar 10. For example, the conductors 125A, 125B and 135 may be made of copper. In some aspects of the disclosure, the material used for the conductors 125A, 125B and 135 may be selected based on its conductivity and the skin depth to make the conductors 125A, 125 and 135 thin. The thickness of the conductors 125A, 125B and 135 and (insulation layers 130) impacts the amount of cancelation of the induced magnetic fields; the thicker the layers, the less magnetic fields are canceled.

Since there are two negative conductors 125A, 125B, each negative conductor will share the current and handle about half of the total current. Therefore, the thicknesses of each negative conductor 125A, 125B may be half the thickness of the positive conductor. The front side of the positive conductor 135 faces the negative conductor 125A and the back side of the positive conductor 135 faces the negative conductor 125B. Thus, current can flow on both sides of the positive conductor 135.

In some aspects of the disclosure, the thickness of the two negative conductors 125A, 125B may be the same as the thickness of conductors 20, 30. For example, the two negative conductors 125A. 125B may have a thickness of about 1 mm (for copper). The thickness of the positive conductor 135 may be 2 mm.

The DC backplane 100 may also have two inner insulators (insulation layer 130). In some aspects of the disclosure, the insulation layer 130 may also be adhesive. For example, the insulation layer 130 may be an insulative bond ply. In some aspects of the disclosure, the insulation layer 130 may be made of polyester. In other aspects, the insulation layer may be made of a film such as polyvinyl fluoride (PVF), polyethylene terephthalate (PET). Thus, the insulation layer 130 serves to insulate the conductors 125A, 125B and 135 and to bond the same together. The thickness of the insulation layers 130 may be based on the current carried by the conductors 125A, 125B and 135 and need for insulation and to reduce the inductance of the DC backplane 100, e.g., to keep the conductors 125A, 125B and 135 close together to enable the magnetic fields to cancel. The thickness of the layers 130 controls the conductor 125A, 125B, 135 spacing. In an aspect of the disclosure, the thickness of each inner insulation layer 130 may be about 0.23 mm.

In an aspect of the disclosure, the insulation layer 130 may be less than 0.25 mm thick.

The DC backplane 100 may also comprise two outer insulation 120A, 120B: one on the front of the DC backplane 100 and the other on the back. The outer insulation 120A, 120B may provide strength to hold the laminated DC busbars 10 to the DC backplane 100. The thickness of the outer insulation 120A, 120B should not materially impact the inductance of the DC backplane 100 since it is outside of the conductive stacked layers. In an aspect of the disclosure, the outer insulation 120A, 120B may be made of the same material as the inner insulation layers 130. Since the outer insulation 120A, 120B is not between the conductors 125A, 125B, 135, the thickness of the outer insulation 120A, 120B does not materially impact the inductance of the DC backplane 100.

As shown in FIG. 14, the conductors 125A, 125B and 135 have a plurality of rows of openings 142 (in FIG. 14, only one opening on each conductor is labeled) and bosses for connecting to respective laminated DC busbars 10. In some aspects of the disclosure, the bosses and openings 142 alternate as shown. The conductors 125A, 125B and 135 also have a row of openings 142 and bosses for connected to a source of DC power.

The outer insulation 120A, 120B and insulation layers 130 also have openings 140 in rows. The size of the openings 140 in the insulations 120A, 120B and 130 may be the same. The openings 140 in the insulations 120A, 120B and 130 substantially align with the openings 142 in the conductors 125A, 125B and 135.

In some aspects of the disclosure, the size of the openings 142 in the conductors 125A, 125B and 135 may be larger than the openings 140 in the insulations 120A, 120B and 130. This is to insure electrical isolation. In some aspects of the disclosure, epoxy spacers 132 may be positioned in the openings 142 to provide creepage and insulation. The epoxy spacers 132 may be glass epoxy spacers. Due to the use of the epoxy spacers 132, the openings 142 may be smaller than without the same and therefore results in greater conductor overlap and limit the inductance of the DC backplane 100.

The conductors 125A. 125, 135 also have small openings in the center of each boss 115A, 115B and 117, respectively. These openings align to form the connection opening 112 (shown in FIG. 12).

Figure 15:
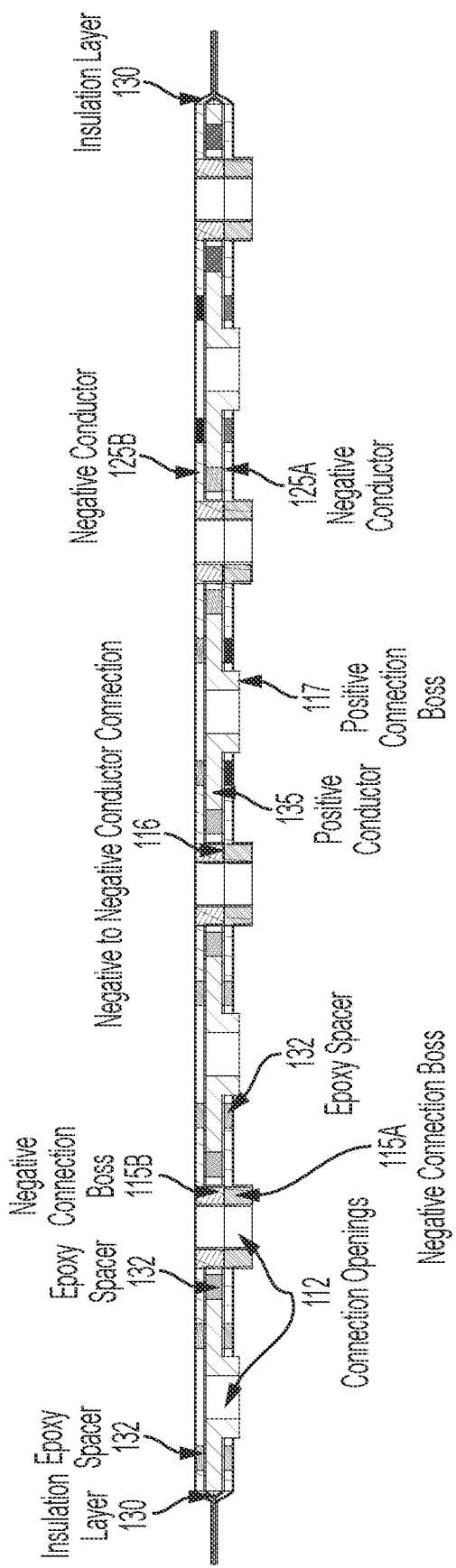
FIG. 15 illustrates a sectional view of an example DC backplane in accordance with aspects of the disclosure.

FIG. 15 illustrates a sectional view of an example of the DC backplane 100 in accordance with aspects of the disclosure showing one row of connection openings 112. As illustrated in FIG. 15, the row has eight openings (although only two are labeled). The two negative conductors 125A, 125B are electrically connected using negative connection bosses 115A, 115B (forming the negative-to-negative-connection 116). As shown in FIG. 15, the negative conductor 125B has a plurality of negative connection bosses 115B projecting from the surface (only one negative connection boss 115B is labeled in FIG. 15). The negative connection bosses 115B project though openings 142 in the positive conductor 135. The negative conductor 125A also has a plurality of negative connection bosses 115A projecting from the surface (only one negative connection boss 115A is labeled in FIG. 15). The negative connection bosses 115B and 115A are aligned (as shown in FIG. 15). A surface of the negative connection bosses 115B (distal surface) contacts a surface of the negative conductor 125A electrically connecting the two negative conductors 125A, 125B. The negative connection bosses 115A are exposed from the DC backplane 100 to make contact with the negative conductor 20 of the DC laminated busbar 10. Epoxy spacers 132 are positioned in the openings 142 of the positive conductor 135 around the negative connection boss 115B where the boss 115 projects through the opening 142.

The positive conductor 135 has a plurality of positive connection bosses 117 projecting from its surface (only one positive connection bosses 117 is labeled in FIG. 15). The positive connection bosses 117 also projects through the openings 142 of the negative conductor 125A. The positive connection bosses 117 are exposed from the DC backplane 100 to connect with the positive conductor 30 in the laminated DC busbar 10. Epoxy spacers 132 are positioned in the openings 142 of the negative conductor 125A around the positive connection boss 117 where the boss 117 projects through the opening 142.

The amount of exposure for the positive connection bosses 117 and the negative connection bosses 115A may be different because the negative conductor 20 may be further away from the DC backplane 100 than the positive conductor 30.

Since connection hardware 1000A is inserted into the connection openings 112 (and openings 140 and 142), epoxy spacers 132 may also be positioned into the openings 142 in the negative conductor 125B to provide creepage and clearance (and insulation).

To mount each laminated DC busbar 10 to the DC backplane 100, connection openings 19 in the first portion 11 of the laminated DC busbar 10 are aligned with the connection openings 112 in the DC backplane 100. Both sets of openings 19, 112 are dimensioned to receive the connection hardware 1000A. The mounting hardware 1000A (shown in FIG. 17) is inserted into back of the DC backplane 100 (outer insulation 120B) and the nut plate 1005A is positioned in the front of the outer insulation 120A and the mounting hardware 1000A is inserted into the nut plate 1005A and torqued down. The mounting hardware 1000A provides both mechanical connection and the electrical connections (metal-to-metal) with the respective conductors. This is why the opening 142 on the negative conductor 125 are allow oversized and epoxy spacers 132 are used. FIG. 2C illustrates an example of three laminated DC busbars 10 mounted to an DC backplane 100 in accordance with aspects of the disclosure. As seen in FIG. 2C, there is clearance between the capacitors 60 and the nut plate 1005A.

The laminated DC busbar 10 and the DC backplane 100 as described herein may have a round trip inductance between the capacitors 60 and the DC backplane 100 may be less than about 1.5 nH. In other aspects of the disclosure, the round-trip inductance between the capacitors 60 and the DC backplane 100 may be less than 1.0 nH. For example, the round-trip inductance between the capacitors 60 and the DC backplane 100 may be 0.8. nH. The round trip inductance between the capacitors 60 and the DC backplane 100 may be measured as described above by shorting the positive leads and the negative leads of the capacitors 60 on the laminated DC busbar 10, the alteration does not result in nonconformance of the process or device. For example, for some elements the term "about" can refer to a variation of +0.1%, for other elements, the term "about" can refer to a variation of +1% or +10%, or any point therein. For example, the term about when used for a measurement in mm, may include +/0.1, 0.2, 0.3, etc., where the difference between the stated number may be larger when the state number is larger. For shorting the positive conductors (via the positive connection bosses 117) and the negative conductors (via either the negative connection bosses 115A or 115B) of the DC backplane for the corresponding row, e.g., row 105A of connected to the row, shorting the shorted positive conductors (via the positive connection bosses 117) and the negative conductors (via either the negative connection bosses 115A or 115B) via wires and injecting current/voltage using an LCR meter into the shorted positive leads and the negative leads of the capacitors and measuring the response (voltage/current response to the input current/voltage). The voltages/current in all of the shorting wires should be measured to compensate as each has an inductance which will contribute to the total measured inductance at the LCR meter. The inductance of each wire may be subtracted from the total measured inductance to arrive at the round-trip inductance between the capacitors 60 and the DC backplane 100.

For example, for the DC backplane shown in FIG. 13, there are 4 positive connection bosses 117 for a row, e.g., row 105A. These 4 positive connection bosses 117 may be shorted using 3 wires. There are also 4 negative connection bosses (115A or 115B) for the same row. These 4 negative connection bosses (115A or 115B) may be shorted using 3 wires. The shorted negative connection bosses (115A or 115B) may be shorted to the shorted positive connection bosses 117 via 1 wire. Thus, 7 wires are used to short the DC backplane for the measurement. The capacitors may be shorted as described above (46 wires). Therefore, for the inductance measurement based on the voltage/current developed at the injected node (shorted positive leads of caps) and (shorted negative leads of caps) because of the injection of current/voltage, the measured inductance should be compensated for the voltage/current at the 53 wires used to short and the same subtracted.

In an aspect of the disclosure, the round-trip inductance between adjacent rows of bosses, e.g., row 105A and 105B, may be less than 1.5 nH. In some aspects of the disclosure, the round-trip inductance between adjacent rows of bosses may be about 1.0 nH. The round-trip inductance may be measured in a similar manner as described above. For example, the positive connection bosses 117 in the adjacent rows may be separately shorted (e.g., 4 positive connection bosses 117 in row 105A and the 4 positive connection bosses 117 in row 105B). The negative connection bosses 115A or 115B in the adjacent rows may also be separately shorted (e.g., 4 negative connection bosses 115A or 115B in row 105A and the 4 negative connection bosses 115A or 115B in row 105B). Then the shorted positive connection bosses 115 in one of the rows (e.g., row 105A) is shorted to the shorted negative connection bosses 117A or 117B in the same row. The inductance is then measured by the LCR meter injecting current/voltage at the node (shorted positive connection bosses 115 in the other of the adjacent rows (e.g., row 105B) and shorted negative connection bosses 117A or 117B in the other of the adjacent rows (e.g., row 105B) and measuring the voltage/current developed at the injected node. The inductance should be compensating again for the wires used for the shorting. For example, for the DC backplane 100 shown in FIG. 13 (example), 3 wires may be used to short the positive connection bosses 115 in each of the two adjacent rows (rows 105A and rows 105B), 3 wires may be used to short the negative connection bosses 115A or 115B in each of the two adjacent rows (rows 105A and rows 105B), and 1 wire may be used to short the shorted positive connection bosses and the negative connection bosses for the same row for a total of 13 wires. The voltage/current developed across these wires may be used to compensate for the total inductance measured at the injected node (subtracted).

The total round-trip inductance between the switches in adjacent modules through the laminated DC busbars 10 and the DC backplane 100: Lroundtrip=2×the round-trip inductance between the laminated DC busbar 100 and the switches+2×the round-trip inductance between the laminated DC busbar 10 and the DC backplane 100+the round trip inductance between adjacent rows of bosses in the DC backplane 100. In an aspect of the disclosure, the round-trip total inductance between the switches in adjacent modules through the laminated DC busbars 10 and the DC backplane 100 may be less than about 7.5 nH. In other aspects of the disclosure, the round-trip total inductance between the switches in adjacent modules through the laminated DC busbars 10 and the DC backplane 100 may be less than about 7.5 nH.

In an aspect of the disclosure, the round-trip inductance between the laminated DC busbar 100 and the switches, the round-trip inductance between the laminated DC busbar 10 and the DC backplane 100, the round-trip inductance between adjacent rows of bosses in the DC backplane 100 may change so long as the total round-trip inductance between the switches in adjacent modules through the laminated DC busbars 10 and the DC backplane 100 is less than described above. In this aspect, the inductance of one of the third listed components of the total should not exceed a preset percentage of the total round-trip inductance. In an aspect of the disclosure, the preset percentage may be about 25%. In an aspect of the disclosure, the preset percentage may be about 35%.

As shown in the figures, the negative conductor 20 (example of a first conductive layer) in the laminated DC busbar 10 is above the positive conductor 30 (example of a second conductive layer). However, in other aspects of the disclosure, the conductors 20, 30 may be reversed.

Additionally, in the figures, there are two negative conductors 125A, 125B around the single positive conductor 135 in the DC backplane. However, in other aspects of the disclosure, the arrangement may be reversed where there are two positive conductors surrounding the negative conductor where the negative conductor is twice as thick as the positive conductor and the positive conductors are electrically connected via the bosses in a similar manner as described herein.

Figure 19A:
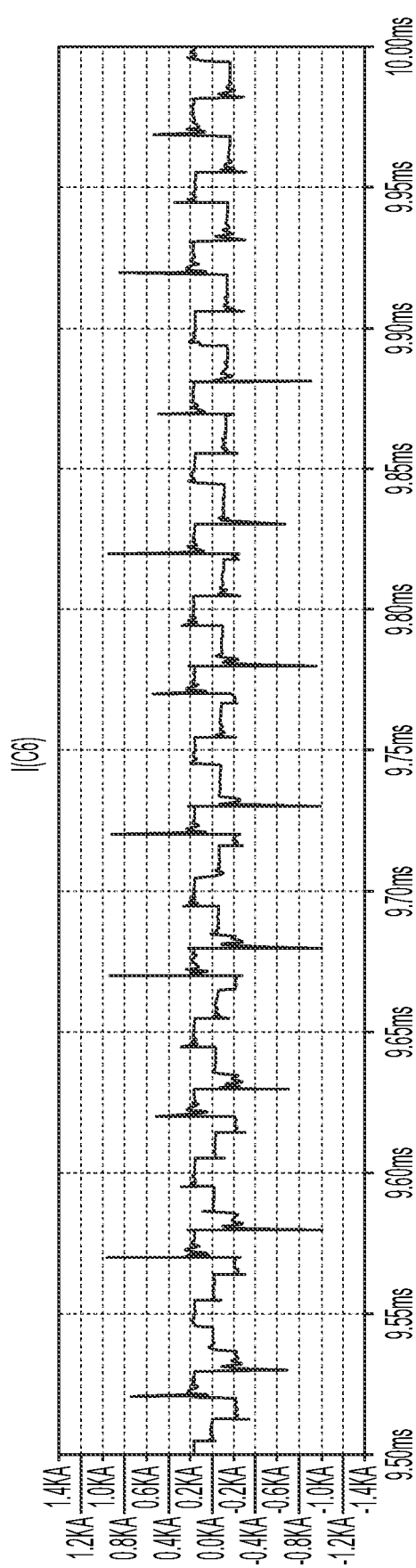
FIGS. 19A and 19B illustrates a comparison of capacitor current where a laminated DC busbar has low inductance in accordance with aspects of the disclosure (FIG. 19A) versus where a laminated DC busbar has high inductance (FIG. 19B).
Figure 19B:
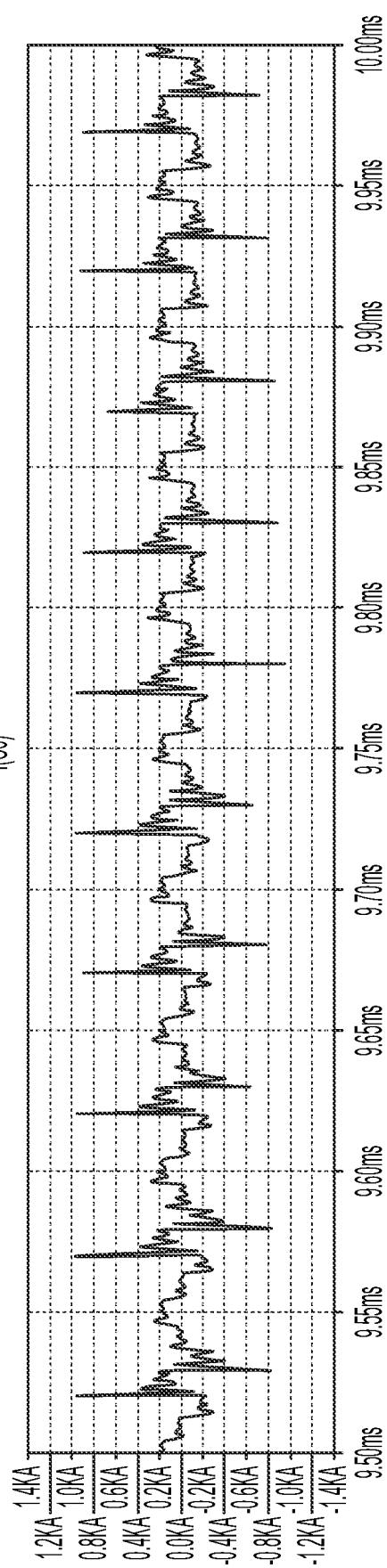

FIGS. 19A and 19B illustrate a comparison of capacitor current where a laminated DC busbar has low inductance in accordance with aspects of the disclosure versus where a laminated DC busbar has high inductance. The simulation had three-single phase out invertor modules connected to a DC backplane (three-laminated DC busbars). The pairs of semiconductor switches in each module were connected in parallel to have the single phase out. The semiconductor switches had a switching frequency of 20 kHz. The DC bus (DC backplane) had a voltage of 600 VDC. The paralleled current was 900 A RMS. The voltage on the outputs was 250 V RMS, line to line. A power factor of 0.8 was used. FIG. 19A illustrates the current flowing in the capacitors 60 where the round-trip inductance between the switches in two adjacent inverter modules was 5 nH. FIG. 19B illustrates the current flowing in the capacitors where the round-trip inductance between the switches in two adjacent inverter modules was 25 nH (high).

As can be seen from FIGS. 19A and 19B, there is a higher overshoot in the current in FIG. 19B, where the inductance is higher. Additionally, there is significantly more ringing in the current in FIG. 19B than in FIG. 19A which could damage the capacitors. As can be seen from FIG. 19A, the lower inductance reduces the magnitude of the ripple current. Additionally, the lower inductance increases the frequency of the ripple current which results in better damping at the high frequencies. For an ideal case, the current RMS is about 156 A RMS. In the 5 nH case, the current was only slightly higher at 159 A RMS, this was a increase about 2%, which results in an increase in loss of 3% from ideal. However, in the 25 nH case, the current is significantly high at 182 A RMS, which is an increase of 16%, which results in an increase in loss of about 35% (a 10 fold loss increase difference).

In the discussion and claims herein, the term "about" indicates that the value listed may be somewhat altered, as long as example, about 1.5 may include 1.2-1.8, where about 20, may include 18.0-22.0.

As used herein, the term "substantially", or "substantial", is equally applicable when used in a negative connotation to refer to the complete or near complete lack of an action, characteristic, property, state, structure, item, or result. For example, a surface that is "substantially" flat would either completely flat, or so nearly flat that the effect would be the same as if it were completely flat. "Substantially" when referring to a shape or size may account for manufacturing where a perfect shapes, such as circular or sizes may be difficult to manufacture.

As used herein terms such as "a", "an" and "the" are not intended to refer to only a singular entity, but include the general class of which a specific example may be used for illustration. As used herein, terms defined in the singular are intended to include those terms defined in the plural and vice versa.

References in the specification to "one aspect", "certain aspects", "some aspects" or "an aspect", indicate that the aspect(s) described may include a particular feature or characteristic, but every aspect may not necessarily include the particular feature, structure, or characteristic. Moreover, such phrases are not necessarily referring to the same aspect. Further, when a particular feature, structure, or characteristic is described in connection with an aspect, it is submitted that it is within the knowledge of one skilled in the art to affect such feature, structure, or characteristic in connection with other aspects whether or not explicitly described.

For purposes of the description hereinafter, the terms "upper", "lower", "right", "left", "vertical", "horizontal", "top", "bottom", and derivatives thereof shall relate to a device relative to a floor and/or as it is oriented in the figures or with respect to a surface.

Reference herein to any numerical range expressly includes each numerical value (including fractional numbers and whole numbers) encompassed by that range. To illustrate, reference herein to a range of "at least 50" or "at least about 50" includes whole numbers of 50, 51, 52, 53, 54, 55, 56, 57, 58, 59, 60, etc., and fractional numbers 50.1, 50.2 50.3, 50.4, 50.5, 50.6, 50.7, 50.8, 50.9, etc. In a further illustration, reference herein to a range of "less than 50" or "less than about 50" includes whole numbers 49, 48, 47, 46, 45, 44, 43, 42, 41, 40, etc., and fractional numbers 49.9, 49.8, 49.7, 49.6, 49.5, 49.4, 49.3, 49.2, 49.1, 49.0, etc.

The terminology used herein is for the purpose of describing particular embodiments only and is not intended to be limiting the scope of the disclosure and is not intended to be exhaustive. Many modifications and variations will be apparent to those of ordinary skill in the art without departing from the scope and spirit of the disclosure.

What is claimed is:

1. A laminated direct current (DC) busbar comprising:
a first conductive layer;
a first insulation structure wrapping the first conductive layer;
a second conductive layer;
a second insulation structure wrapping the second conductive layer; and
a bonding layer binding the first insultation structure and the second insulation structure,
the first conductive layer, the second conductive layer and the first insulation structure and the second insulation structure having a bending to form a first portion and a second portion separated by the bending, where the first portion and the second portion are angled relative to each other,
the first portion being configured to connect the laminated DC busbar to a DC backplane, where the DC backplane is connectable to at least one other laminated DC busbar, where the second portion is configured to connect the laminated DC busbar to terminals of an inverter, where the inverter has a switching unit and respective pairs of terminals, each pair having a first terminal and a second terminal;

the first portion having at least three openings for connecting the laminated DC busbar to the DC backplane, for each of the at least three openings, each of the first conductive layer, the second conductive layer and the first insulation structure and the second insulation structure has an opening at least partially aligned, where a size of the openings in the first insulation structure and the second insulation structure are the same size, where a conductive layer which electrically connects to the DC backplane alternates based on the at least three openings, where the conductive layer which electrically connects to the DC backplane through an opening in the first portion extends into the respective opening of the first portion, whereas the conductive layer that does not electrically connect to the DC backplane through the same opening in the first portion surrounds that opening, the second portion having a plurality of first openings and a plurality of second openings adjacent to an edge facing the terminals of the inverter, the first openings and the second openings alternating on the first conductive layer, the first openings and the second openings alternating on the second conductive layer, the first openings of the first conductive layer at least partially aligned with the second openings of the second conductive layer and the second openings of the first conductive layer at least partially aligned with the first openings on the second conductive layer, the first conductive layer having a plurality of first bushings, each first bushing projecting from the first conductive layer and surrounding a respective the first opening of the first conductive layer, each first bushing configured and dimensioned to contact a respective first terminal of the inverter, the second conductive layer having a plurality of second bushings, each second bushing projecting from the second conductive layer through the first conductive layer and surrounding a respective the first opening of the second conductive layer, each second bushing configured and dimensioned to contact a respective second terminal of the inverter, and the first insulation structure and the second insulation structure having third openings at least partially aligned with the first openings and the second openings.

2. The laminated DC busbar of claim 1, wherein the first bushings and the second bushings have different heights.

3. The laminated DC busbar of claim 1, wherein the second portion has a plurality of first capacitor openings and second capacitor openings, the second capacitor openings comprising at least one lead slit and a plurality of thermal slits, the first capacitor opening and the second capacitor opening alternating on both the first conductive layer and the second conductive layer, such that a first capacitor opening of the first conductive layer aligns with the second capacitor opening of the second conductive layer, each of the at least one lead slit configured for one of the leads of capacitors to be inserted, the first insulation structure and the second insulation structure have capacitor openings at least partially aligned with the first capacitor openings and the second capacitor openings, wherein the capacitors are connected in parallel, and wherein the laminated DC busbar has greater than a predetermined number of capacitors.

4. The laminated DC busbar of claim 3, wherein each slit for a lead is at least partially surrounded by thermal slits.

5. The laminated DC busbar of claim 1, wherein the plurality of first capacitor openings has epoxy spacers, respectively configured to a provide creepage barrier.

6. The laminated DC busbar of claim 3, wherein the predetermined number is 24.

7. The laminated DC busbar of claim 1, wherein the at least three openings in the first portion is 8.

8. The laminated DC busbar of claim 1, wherein the first conductive layer and the second conductive layer each have a thickness of about 1 mm.

9. The laminated DC busbar of claim 1, wherein the first portion is orthogonal to the second portion.

10. The laminated DC busbar of claim 3, wherein a round-trip inductance between the plurality of capacitors and switches of the inverter is less than or equal to about 1.5 nH.

11. The laminated DC busbar of claim 1, wherein the second openings in the second portion have epoxy spacers and wherein the openings in a conductive layer in the first portion not making electrical contact with the DC backplane have epoxy spacers.

* * * * *